(12) United States Patent
Sasaki et al.

(10) Patent No.: US 12,027,346 B2
(45) Date of Patent: Jul. 2, 2024

(54) SUBSTRATE PROCESSING APPARATUS AND METHOD OF DRIVING RELAY MEMBER

(71) Applicant: TOKYO ELECTRON LIMITED, Tokyo (JP)

(72) Inventors: Nobutaka Sasaki, Miyagi (JP); Shin Matsuura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 526 days.

(21) Appl. No.: 17/386,464

(22) Filed: Jul. 27, 2021

(65) Prior Publication Data
US 2022/0037125 A1 Feb. 3, 2022

(30) Foreign Application Priority Data
Aug. 3, 2020 (JP) ................. 2020-131841

(51) Int. Cl.
*H01J 37/32* (2006.01)
*H01J 41/02* (2006.01)
*H01L 21/67* (2006.01)

(52) U.S. Cl.
CPC .. *H01J 37/32477* (2013.01); *H01J 37/32449* (2013.01); *H01J 37/32513* (2013.01); *H01J 37/32651* (2013.01); *H01J 37/32816* (2013.01); *H01J 37/32834* (2013.01); *H01J 41/02* (2013.01); *H01L 21/67253* (2013.01); *H01J 2237/166* (2013.01); *H01J 2237/334* (2013.01)

(58) Field of Classification Search
None
See application file for complete search history.

(56) References Cited

U.S. PATENT DOCUMENTS

2015/0187542 A1* 7/2015 Ishida ............... H01J 37/32495
156/345.1

FOREIGN PATENT DOCUMENTS

| JP | 2015-119069 A | 6/2015 |
|----|---------------|--------|
| JP | 2015-126197 A | 7/2015 |

* cited by examiner

*Primary Examiner* — Feifei Yeung Lopez
(74) *Attorney, Agent, or Firm* — Nath, Goldberg & Meyer; Jerald L. Meyer; Tanya E. Harkins

(57) ABSTRACT

A substrate processing apparatus includes a chamber including a processing room for processing of a substrate using an introduced gas and an exhaust room for exhausting the gas in the processing room, a shield member provided near a side wall of the chamber to separate the processing room and the exhaust room and including a hole allowing the processing room and the exhaust room to communicate with each other, the shield member being driven in a vertical direction, and a hollow relay member connected to a pipe connected to an instrument outside the chamber and configured to be driven in a horizontal direction. When the shield member reaches an upper position, the relay member is driven inwardly of the chamber to be connected to the shield member at its inward end to allow the processing room and the pipe to communicate with each other through the hole.

20 Claims, 18 Drawing Sheets

SUBSTRATE PROCESSING APPARATUS AND METHOD OF DRIVING RELAY MEMBER

CROSS-REFERENCE TO RELATED APPLICATION

This application is based upon and claims the benefit of priority from Japanese Patent Application No. 2020-131841, filed on Aug. 3, 2020, the entire contents of which are incorporated herein by reference.

TECHNICAL FIELD

The present disclosure relates to a substrate processing apparatus and a method of driving a relay member.

BACKGROUND

Conventionally, a substrate processing apparatus that performs desired processing on a substrate by introducing a gas is known. The substrate processing apparatus includes a chamber having a processing room in which a substrate is placed and gas is introduced, and an exhaust room for exhausting the gas in the processing room. A deposition shield is provided in the chamber so that deposits generated in processing, such as etching, do not adhere to the inner wall of the chamber. The deposition shield separates the processing room and the exhaust room from each other in the chamber. In the substrate processing apparatus, when performing desired processing, a pressure, which is a value indicating a state in the processing room, is measured and controlled so as to match process conditions. In order to accurately measure the pressure in the processing room in the chamber in a state in which the deposition shield is provided, it has been proposed to provide a sleeve in a pressure gauge introduction portion.

In addition, the chamber is provided with an opening for loading and unloading a substrate therethrough, and a gate valve for opening/closing the opening is disposed in the chamber. For this reason, the deposition shield is provided with a shutter that is openable by being driven up and down depending on the position of the opening in the chamber.

PRIOR ART DOCUMENT

Patent Document

Patent Document 1: Japanese Laid-Open Patent Publication No. 2015-119069
Patent Document 1: Japanese Laid-Open Patent Publication No. 2015-126197

SUMMARY

According to the embodiments of the present disclosure, there is provided a substrate processing apparatus including: a chamber including a processing room in which processing is performed on a substrate using an introduced gas and an exhaust room configured to exhaust the gas in the processing room; a shield member provided at least in a part near a side wall of the chamber so as to separate the processing room and the exhaust room from each other and including, in a portion of a wall surface of the shielding member that is parallel to the side wall of the chamber, a hole that allows the processing room and the exhaust room to communicate with each other, the shield member being configured to be capable of being driven in a vertical direction; and a hollow relay member connected to a pipe connected to an instrument outside the chamber and configured to be capable of being driven in a horizontal direction, so that, when the shield member reaches an upper end position, the relay member is driven inwardly of the chamber and is connected to the shield member at an end portion of the relay member facing inwardly of the chamber to allow the processing room and the pipe to communicate with each other through the hole.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of a substrate processing apparatus and a method of driving a relay member disclosed herein will be described in detail with reference to the drawings. The technology disclosed herein is not limited by the following embodiments.

In a substrate processing apparatus, it is required to measure a pressure, which is a value indicating a state in the processing room, at a plurality of locations depending on process conditions. In this case, it is impossible to provide a conventional sleeve on a shutter that is driven up and down. Thus, when the shutter of the deposition shield is large, the place in which the sleeve is installed is limited, and it is difficult to measure a desired pressure. Therefore, it is demanded to accurately measure a state (e.g., pressure) in the processing room even at a driving location of a deposition shield, such as a shutter.

Configuration of Substrate-Processing Apparatus

Figure 1:
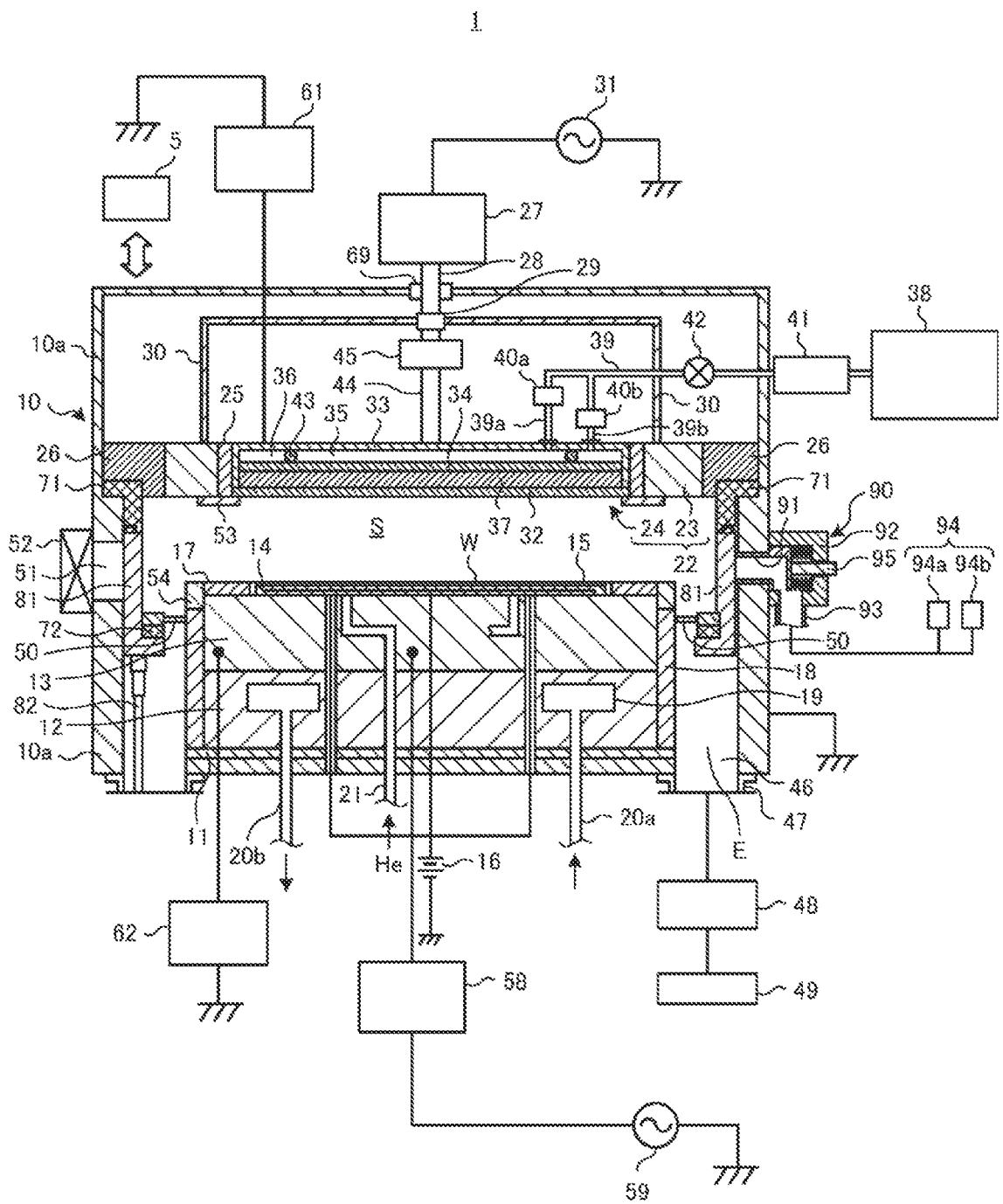
FIG. 1 is a view illustrating an exemplary substrate processing apparatus according to an embodiment of the present disclosure.

FIG. 1 is a view illustrating an exemplary substrate processing apparatus according to an embodiment of the present disclosure. Hereinbelow, the case where the substrate processing apparatus is a plasma processing apparatus will be described as an example, but the present disclosure is not limited thereto. The substrate processing apparatus may be any substrate processing apparatus having a shutter member or a deposition shield that is driven up and down.

In FIG. 1, a plasma processing apparatus 1 is configured as a capacitively coupled parallel plate plasma etching apparatus, and includes, for example, a cylindrical chamber (a processing room) 10 made of aluminum, the surface of which is subjected to alumite treatment (anodized). The chamber 10 is grounded for security. However, the present disclosure is not limited thereto. The plasma processing apparatus 1 is not limited to the capacitively coupled parallel plate plasma etching apparatus, and may be any type of plasma processing apparatus, such as an inductively coupled plasma (ICP) processing apparatus, a microwave plasma processing apparatus, a magnetron plasma processing apparatus, or the like.

In the bottom portion of the chamber 10, a columnar susceptor support 12 is disposed via an insulating plate 11 made of ceramic or the like, and a conductive susceptor 13 made of, for example, aluminum or the like is disposed on the susceptor support 12. The susceptor 13 has a configuration in which it functions as a lower electrode, and a substrate to be etched (e.g., a wafer W as a semiconductor wafer) is placed thereon.

An electrostatic chuck (ESC) 14 configured to hold a wafer W using an electrostatic attraction is disposed on the top surface of the susceptor 13. The electrostatic chuck 14 includes an electrode plate 15 made of a conductive film and a pair of insulating layers between which the electrode plate 15 made of a dielectric, such as $Y_2O_3$, $Al_2O_3$, or AlN, is sandwiched, and a DC power supply 16 is electrically connected to the electrode plate 15 via a connection terminal. The electrostatic chuck 14 attracts and holds a wafer W using a Coulomb force or a Johnsen-Rahbek force generated by a DC voltage applied by the DC power supply 16.

In addition, a plurality of (e.g., three) pusher pins as lift pins that are capable of protruding from the top surface of the electrostatic chuck 14 are disposed on the top surface of the electrostatic chuck 14 where the wafer W is attracted and held. These pusher pins are connected to a motor (not illustrated) via a ball screw (not illustrated), and freely protrude from the top surface of the electrostatic chuck 14 by the rotational movement of the motor, which is converted to linear motion by the ball screw. As a result, the pusher pins penetrate the electrostatic chuck 14 and the susceptor 13 and move up and down in the internal space so as to protrude and retract. When a wafer W is etched and the electrostatic chuck 14 attracts and holds the wafer W, the pusher pins are accommodated in the electrostatic chuck 14. When the etched wafer W is unloaded from the plasma generation space S, the pusher pins protrude from the electrostatic chuck 14 to separate the wafer W from the electrostatic chuck 14 and lift the wafer W upward.

An edge ring 17 made of, for example, silicon (Si) is disposed on the peripheral top surface of the susceptor 13 in order to improve etching uniformity, and a cover ring 54 is disposed around the edge ring 17 in order to protect the side portion of the edge ring 17. The side surfaces of the susceptor 13 and the susceptor support 12 are covered with a cylindrical member 18 made of, for example, quartz ($SiO_2$).

Inside the susceptor support 12, for example, a coolant chamber 19 extending in the circumferential direction is disposed. A coolant having a predetermined temperature (e.g., cooling water) is circulated and supplied to the coolant chamber 19 from an external chiller unit (not illustrated) via pipes 20a and 20b. The coolant chamber 19 controls the processing temperature of the wafer W on the susceptor 13 by the temperature of the coolant.

In addition, by supplying a heat transfer gas (e.g., helium (He) gas) from a heat transfer gas supply mechanism (not illustrated) between the top surface of the electrostatic chuck 14 and the rear surface of the wafer W through a gas supply line 21, heat transfer between the wafer W and the susceptor 13 is efficiently and uniformly controlled.

Above the susceptor 13, an upper electrode 22 is disposed so as to be parallel to and face the susceptor 13. Here, the space formed between the susceptor 13 and the upper electrode 22 functions as a plasma generation space S (the space in the processing room). The upper electrode 22 includes an annular or donut-shaped outer upper electrode 23, which is disposed so as to face the susceptor 13 at a predetermined distance, and a disk-shaped inner upper electrode 24 disposed radially inside the outer upper electrode 23 so as to be insulated from the outer upper electrode 23. In addition, regarding plasma generation, the outer upper electrode 23 serves as a main electrode, and the inner upper electrode 24 serves as an auxiliary electrode.

An annular gap (clearance) of, for example, 0.25 to 2.0 mm is formed between the outer upper electrode 23 and the inner upper electrode 24, and a dielectric body 25 made of, for example, quartz is arranged in the gap. Further, a ceramic body may be disposed in this gap instead of the dielectric body 25 made of quartz. A capacitor is formed by sandwiching the dielectric body 25 between the outer upper electrode 23 and the inner upper electrode 24. The capacitance C1 of the capacitor is selected or adjusted to a desired value depending on the size of the gap and the dielectric constant of the dielectric body 25. In addition, an annular insulating shielding member 26 made of, for example, alumina ($Al_2O_3$) or yttria ($Y_2O_3$) is hermetically disposed between the outer upper electrode 23 and the side wall of the chamber 10.

The outer upper electrode 23 is preferably made of a low-resistance conductor or semiconductor having low Joule heat, such as silicon. The upper radio frequency power supply 31 is electrically connected to the outer upper electrode 23 via the upper matcher 27, the upper feeding rod 28, the connector 29, and the power-feeding cylinder 30. The upper matcher 27 serves to cause a load impedance to match the internal (or output) impedance of the upper radio frequency power supply 31 so that, when plasma is generated in the chamber 10, the output impedance of the upper radio frequency power supply 31 and the load impedance apparently match each other. The output terminal of the upper matcher 27 is connected to the upper end of the upper feeding rod 28.

The power-feeding cylinder 30 is made of a substantially cylindrical or conical conductive plate (e.g., an aluminum or copper plate), the lower end of the power-feeding cylinder 30 is continuously connected to the outer upper electrode 23 in the circumferential direction, and the upper end of the power-feeding cylinder 30 is electrically connected to the lower end of the upper feeding rod 28 via the connector 29. Outside the power-feeding cylinder 30, the side wall of the chamber 10 extends above the height position of the upper electrode 22 to form a cylindrical ground conductor 10*a*. The upper end of the cylindrical ground conductor 10*a* is electrically insulated from the upper feeding rod 28 by a cylindrical insulating member 69. In this configuration, in a load circuit viewed from the connector 29, the power-feeding cylinder 30, the outer upper electrode 23, and the ground conductor 10*a* form a coaxial line having the power-feeding cylinder 30 and the outer upper electrode 23 as a waveguide.

The inner upper electrode 24 has an upper electrode plate 32 and an electrode support 33. The upper electrode plate 32 is made of a semiconductor material, such as silicon or silicon carbide (SiC), and has therein a large number of electrode plate gas vent holes (first gas vent holes) (not illustrated). The electrode support 33 is a conductive material that detachably supports the upper electrode plate 32, and is made of, for example, aluminum, the surface of which is anodized. The upper electrode plate 32 is fastened to the electrode support 33 by bolts (not illustrated). The heads of the bolts are protected by an annular shield ring 53 disposed below the upper electrode plate 32.

In the upper electrode plate 32, each electrode plate gas vent hole penetrates the upper electrode plate 32. Inside the electrode support 33, a buffer room into which a processing gas to be described later is introduced is formed. The buffer room is composed of two buffer rooms divided by, for example, an annular partition member 43 made of an O-ring, that is, a central buffer room 35 and a peripheral buffer room 36, and the lower portion thereof is open. Below the electrode support 33, a cooling plate (hereinafter, referred to as "C/P") 34 (an intermediate member) that closes the lower portion of the buffer room is disposed. The C/P 34 is made of aluminum, the surface of which is anodized, and has therein a large number of C/P gas vent holes (second gas vent holes) (not illustrated). Each C/P gas vent hole formed in the C/P 34 penetrates the C/P 34.

In addition, a spacer 37 made of a semiconductor material, such as silicon or silicon carbide, is interposed between the upper electrode plate 32 and the C/P 34. The spacer 37 is a disk-shaped member, and includes a large number of top surface annular grooves formed concentrically with a disk in the surface facing the C/P 34 (hereinafter, simply referred to as a "top surface") and a large number of spacer gas vent holes (third gas vent holes) that open in the bottom portion of each top surface annular groove while penetrating the spacer 37.

The inner upper electrode 24 supplies a processing gas introduced into the buffer room from a processing gas supply source 38, which will be described later, to a plasma generation space S through the C/P gas vent holes in the C/P 34, a spacer gas flow path in the spacer 37, and the electrode plate gas vent holes in the upper electrode plate 32. Here, the central buffer room 35, the plurality of C/P gas vent holes, the spacer gas flow path, and the electrode plate gas vent holes existing below the central buffer room 35 form a central shower head (a processing gas supply path). In addition, the peripheral buffer room 36, the plurality of C/P gas vent holes, the spacer gas flow path, and the electrode plate gas vent holes existing below the peripheral buffer room 36 form a peripheral shower head (a processing gas supply path).

In addition, as illustrated in FIG. 1, a processing gas supply source 38 is disposed outside the chamber 10. The processing gas supply source 38 supplies a processing gas to the central buffer room 35 and the peripheral buffer room 36 at a desired flow rate ratio. Specifically, the gas supply pipe 39 from the processing gas supply source 38 branches into two branch pipes 39*a* and 39*b* on the way, and the branch pipes 39*a* and 39*b* are connected to the central buffer room 35 and the peripheral buffer room 36, respectively. The branch pipes 39*a* and 39*b* have flow rate control valves 40*a* and 40*b* (flow rate control devices), respectively. The conductances of the flow paths from the processing gas supply source 38 to the central buffer room 35 and the peripheral buffer room 36 are set to be equal. Therefore, by adjusting the flow rate control valves 40*a* and 40*b*, it is possible to arbitrarily adjust the flow rate ratio between the processing gas supplied to the central buffer room 35 and the processing gas supplied to the peripheral buffer room 36. In addition, the gas supply pipe 39 is provided with a mass flow controller (MFC) 41 and an opening/closing valve 42.

With the configuration described above, the plasma processing apparatus 1 arbitrarily adjusts the ratio (FC/FE) between the flow rate FC of the gas ejected from the central shower head and the flow rate FE of the gas ejected from the peripheral shower head by adjusting the flow rate ratio between the processing gas introduced into the central buffer room 35 and the processing gas introduced into the peripheral buffer room 36. It is also possible to individually adjust the flow rate of the processing gas ejected from each of the central shower head and the peripheral shower head per unit area. Furthermore, by disposing two processing gas supply sources corresponding to the respective branch pipes 39a and 39b, it is also possible to independently or separately set the gas types or gas mixing ratios of the processing gases to be ejected from the central shower head and the peripheral shower head, respectively. However, the present disclosure is not limited thereto, and the plasma processing apparatus 1 may be incapable of adjusting the ratio between the flow rate FC of the gas ejected from the central shower head and the flow rate FE of the gas ejected from the peripheral shower head.

In addition, the upper radio frequency power supply 31 is electrically connected to the electrode support 33 of the inner upper electrode 24 via the upper matcher 27, the upper feeding rod 28, the connector 29, and upper power-feeding cylinder 44. A variable capacitor 45 capable of variably adjusting the capacitance is disposed in the middle of the upper power-feeding cylinder 44. In addition, the outer upper electrode 23 and the inner upper electrode 24 may also be provided with a coolant room or a cooling jacket (not illustrated), and the temperature of the electrodes may be controlled using the coolant supplied from the external chiller unit (not illustrated).

An exhaust port 46 is provided in the bottom portion of the chamber 10. An automatic pressure control valve (hereinafter, referred to as an "APC valve") 48, which is a variable butterfly valve, and a turbo molecular pump (hereinafter, referred to as "TMP") 49 are connected to the exhaust port 46 via an exhaust manifold 47. The APC valve 48 and the TMP 49 cooperate to reduce the pressure of the plasma generation space S in the chamber 10 to a predetermined degree of vacuum. In addition, between the exhaust port 46 and the plasma generation space 5, an annular baffle plate 50 having therein a plurality of vent holes is disposed so as to surround the susceptor 13, and the baffle plate 50 prevents plasma leakage from the plasma generation space S to the exhaust port 46. That is, the plasma generation space S is an example of the processing room, and the exhaust space E from the baffle plate 50 to the exhaust port 46 is an example of the exhaust room.

An opening 51 for loading/unloading a wafer W is provided in the outer side wall of the chamber 10, and a gate valve 52 for opening/closing the opening 51 is disposed on the outer side wall. In the chamber 10, a first deposition shield 71 and a second deposition shield 72 are detachably provided along the inner wall of the chamber 10. The first deposition shield 71 is an upper member of the deposition shield, and is provided above the opening 51 in the chamber 10. The second deposition shield 72 is a lower member of the deposition shield, and is provided below the baffle plate 50. The lower portion of the first deposition shield 71 closes the opening 51 by coming into contact with the upper portion of a valve body 81 of the shutter mechanism. The first deposition shield 71 and the second deposition shield 72 may be configured, for example, by coating an aluminum material with ceramic such as $Y_2O_3$. The lower portion of the first deposition shield 71 is coated with a conductive material, such as stainless steel or a nickel alloy, so as to be conductive with the valve body 81, which is in contact therewith.

A wafer W is loaded/unloaded by opening/closing the gate valve 52. After the loading/unloading is completed and the gate valve 52 is closed, the valve body 81 blocks the space between the first deposition shield 71 and the second deposition shield 72, and the opening 51 of the chamber 10 and the plasma generation space S are blocked. The valve body 81 is driven up and down by the lifting mechanism 82 to open/close the space between the first deposition shield 71 and the second deposition shield 72, that is, the opening 51. The lifting mechanism 82 is disposed below, for example, the second deposition shield 72. The valve body 81 and the lifting mechanism 82 may be collectively referred to as a "shutter mechanism". In other words, the valve body 81 is a shield member that is provided in at least a portion near the side wall of the chamber 10 to separate the processing room and the exhaust room, and is capable of being driven in the vertical direction. In addition, the valve body 81 has, in the portion connected to a sleeve 91 to be described later, a hole for allowing the plasma generation space S (the processing room) and the exhaust space E (the exhaust room) to communicate with each other.

In the plasma processing apparatus 1, a lower radio frequency power supply (first radio frequency power supply) 59 is electrically connected to the susceptor 13 as a lower electrode via the lower matcher 58. The lower matcher 58 is provided so as to match a load impedance with the internal (or output) impedance of the lower radio frequency power supply 59, and serves to cause the internal impedance of the lower radio frequency power supply 59 and the load impedance to apparently match each other when plasma is generated in the plasma generation space S in the chamber 10. In addition, another second lower radio frequency power supply (second radio frequency power supply) may be connected to the lower electrode.

In the plasma processing apparatus 1, a low-pass filter (LPF) 61 is electrically connected to the inner upper electrode 24 so as to pass the radio frequency power from the lower radio frequency power supply 59 to a ground, while not passing the radio frequency power from the upper radio frequency power supply 31 to the ground. The LPF 61 preferably includes an LR filter or an LC filter. However, since it is possible to apply a sufficiently large reactance to the radio frequency power from the upper radio frequency power supply 31 even with one conducting wire, one conducting wire may be electrically attached to the inner upper electrode 24, instead of the LR filter or the LC filter. Meanwhile, a high-pass filter (HPF) 62 is electrically connected to the susceptor 13 so as to pass the radio frequency power from the upper radio frequency power supply 31 to the ground.

A sleeve drive mechanism 90 is provided on the side wall of the chamber 10. The sleeve drive mechanism 90 includes a sleeve 91 and a drive mechanism 92. A pipe 93 is connected to the lower portion of the drive mechanism 92. The pipe 93 is a pipe that connects the drive mechanism and capacitance manometers 94a and 94b to each other. In the following description, the capacitance manometers 94a and 94b are also collectively referred to as a "capacitance manometer 94". A plurality of sleeve drive mechanisms 90 and capacitance manometers 94 may be provided.

The sleeve 91 is a hollow relay member, penetrates the side wall of the chamber 10 to come into contact with the valve body 81, and allows the plasma generation space S, which is a processing room, and the pipe 93 to communicate with each other through a hole provided in the valve body 81. The drive mechanism 92 is able to bring the sleeve 91 into contact with the valve body 81 or separate the sleeve 91 from the valve body 81 by driving the drive shaft 95 connected to the sleeve 91 in the horizontal direction. The capacitance manometer 94a is able to measure a pressure in the range of 0 mT to 10 T (0 Pa to 1333 Pa). The capacitance manometer 94b is able to measure a pressure in the range of 0 mT to 250 mT (0 Pa to 33.3 Pa). In the present embodiment, two capacitance manometers 94a and 94b having different measurement ranges are installed, but the pressure gauge is not limited thereto, and one or three or more capacitance manometers 94 may be installed. The pipe 93 may be provided with a valve for protecting the capacitance manometer 94 when the inside of the chamber 10 is open to the air. In addition, the pressure gauge is not limited to the capacitance manometer 94, and a Pirani gauge or the like may be used.

The controller 5 has a memory, a processor, and an input/output interface. The processor in the controller 5 controls each part of the plasma processing apparatus 1 via the input/output interface of the controller 5 by reading and executing a program stored in the memory in the controller 5.

Next, when etching is performed in the plasma processing apparatus 1, the gate valve 52 and the valve body 81 are first opened, and a wafer W to be processed is loaded into the chamber 10 and placed on the susceptor 13. Then, a processing gas (e.g., a mixed gas of $C_4F_8$ gas and argon (Ar) gas) is introduced into the central buffer chamber 35 and the peripheral buffer chamber 36 from the processing gas supply source 38 at a predetermined flow rate and flow rate ratio. In addition, the pressure of the plasma generation space S in the chamber 10 is set using the APC valve 48 and the TMP 49 to a value suitable for etching (e.g., a value in the range of several mTorr to 1 Torr).

Radio frequency power for plasma generation is applied from the upper radio frequency power supply 31 to the upper electrodes 22 (the outer upper electrode 23 and the inner upper electrode 24) at a predetermined power, and radio frequency power for bias is applied from the lower radio frequency power supply 59 to the lower electrode of the susceptor 13 at a predetermined power. In addition, a DC voltage is applied from the DC power supply 16 to the electrode plate 15 of the electrostatic chuck 14, and a wafer W is electrostatically attracted to the susceptor 13.

Then, plasma is generated in the plasma generation space S using the processing gas ejected from the shower head, and the surface to be processed of the wafer W is physically or chemically etched by the radicals and ions generated at that time.

In the plasma processing apparatus 1, the plasma is densified in a desirable dissociated state by applying a radio frequency in a frequency region having a high frequency (a frequency region in which ions are not movable) to the upper electrode 22. In addition, it is possible to form high-density plasma even under lower pressure condition.

Meanwhile, in the upper electrode 22, using the outer upper electrode 23 as a main radio frequency electrode for plasma generation and the inner upper electrode 24 as an auxiliary electrode, it is possible to adjust the ratio of electric field strengths applied to the electrons directly under the upper electrode 22 by the upper radio frequency power supply 31 and the lower radio frequency power supply 59, respectively. Therefore, it is possible to arbitrarily and precisely control the spatial characteristics of reactive ion etching by controlling the distribution of ion density in the radial direction.

Details of Sleeve Drive Mechanism 90

Figure 2:
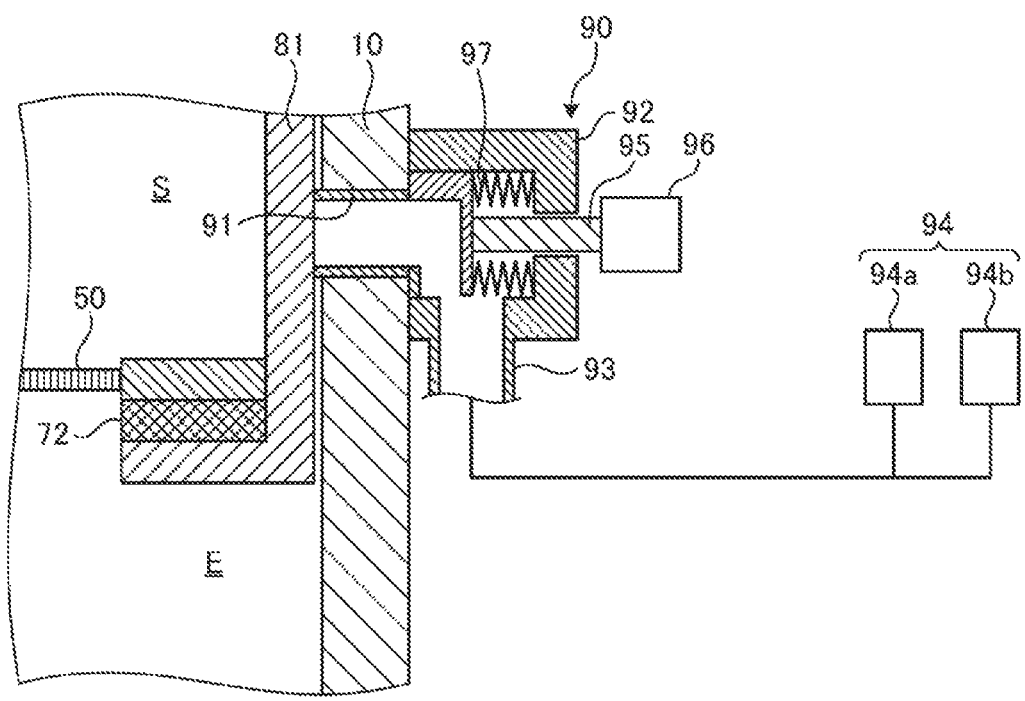
FIG. 2 is a partial enlarged view illustrating an exemplary cross section of a sleeve drive mechanism in the present embodiment.

FIG. 2 is a partial enlarged view illustrating an exemplary cross section of a sleeve drive mechanism in the present embodiment. As illustrated in FIG. 2, the drive shaft 95 of the drive mechanism 92 has a columnar flange in a connection part with the sleeve 91. The inside of the flange is hollow so as to allow the sleeve 91 and the pipe 93 to communicate with each other. The flange and the drive mechanism 92 are connected by a bellows 97, so that the hollow portion of the flange and the outside of the drive mechanism 92 are separated from each other. The drive shaft 95 is driven horizontally by a drive part 96 inwardly and outwardly of the chamber 10, so that the end portion of the sleeve 91 on the inward side of the chamber 10, that is, the end portion on the side in contact with the valve body 81, is moved so as to be capable of protruding and retracting with respect to the inside of the side wall (hereinafter, also referred to as an "inner wall"), of the chamber 10. As the drive part 96, for example, an actuator capable of driving the drive shaft 95 in the horizontal direction (e.g., a motor or an air cylinder) is applicable. The bellows 97 is formed to be stretchable. The bellows 97 connects the flange of the drive shaft 95 to the inner wall of the drive mechanism 92.

Figure 3:
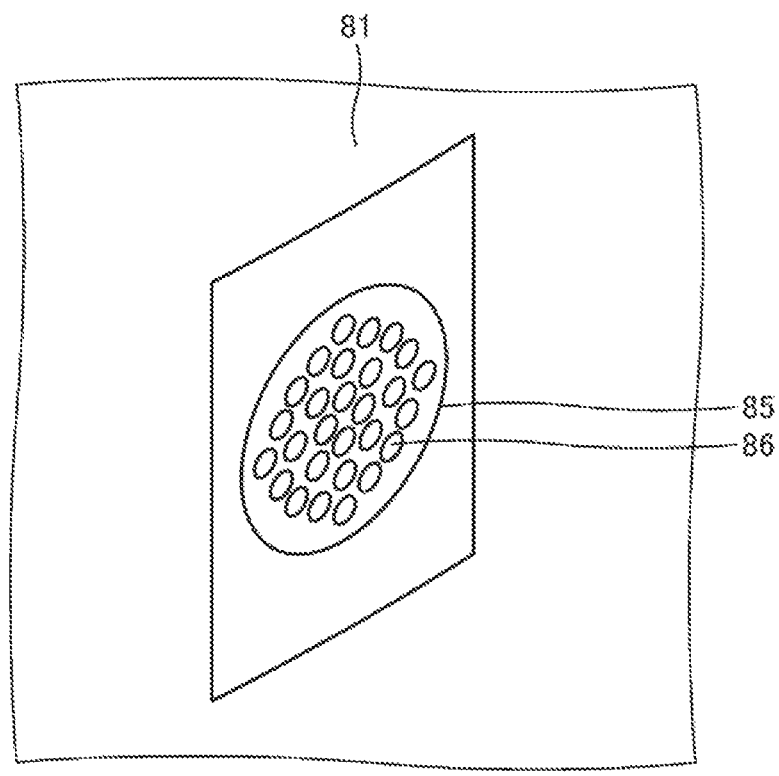
FIG. 3 is a view illustrating an exemplary sleeve contact surface of a shield member in the present embodiment.

FIG. 3 is a view illustrating an exemplary sleeve contact surface of a shield member in the present embodiment. As illustrated in FIG. 3, in a case of a surface-contact type, an O-ring 85 and holes 86 are provided on a surface of the valve body 81 as a shield member, with which the sleeve 91 comes into contact. The contact surface is a flat surface. In a case where the valve body 81 has a curved surface with a large radius R, the contact surface may be a curved surface. In addition, when the contact surface is a curved surface, the O-ring 85 may be deformed so as to bring the sleeve 91 into close contact with the contact surface by deforming the O-ring 85, or the end portion of the sleeve 91 may be made to match the R of the valve body 81. The O-ring 85 is installed on the valve body 81 by providing a dovetail groove or the like on the surface of the valve body 81. The O-ring 85 seals the space inside the sleeve 91 by being brought into contact with the end portion of the sleeve 91. The holes 86 allow the plasma generation space S side of the valve body 81 to communicate with the exhaust space E side of the valve body 81. When the sleeve 91 is brought into close contact with the valve body 81 via the O-ring 85, the plasma generation space S and the space inside the sleeve 91 are connected to each other to make a state where they are separated from the exhaust space E.

FIG. 2 illustrates a state in which the sleeve 91 is in contact with the valve body 81. In this state, the plasma generation space S (the processing room) and the pipe 93 communicate with each other through the holes 86 provided in the valve body 81, the sleeve 91, and the hollow portions in the flange of the drive shaft 95 and the drive mechanism 92. Thus, the pressure in the plasma generation space S is transmitted to the capacitance manometer 94. At this time, the pressure measured by the capacitance manometer 94 is not affected by disturbances such as the exhaust space E.

Next, when the drive shaft 95 is moved outwardly of the chamber 10, the sleeve 91 is separated from the valve body 81, and the end portion of the sleeve 91 on the side in contact with the valve body 81 is in a state of being retracted with respect to the inner wall of the chamber 10. That is, a gap is formed between the valve body 81 and the sleeve 91. In this state, the plasma generation space S (the processing room), the exhaust space E (the exhaust room), and the pipe 93 are in communication with each other through the holes 86 provided in the valve body 81. In addition, the valve body 81 is in a state where it is capable of being driven in the vertical direction.

Figure 4:
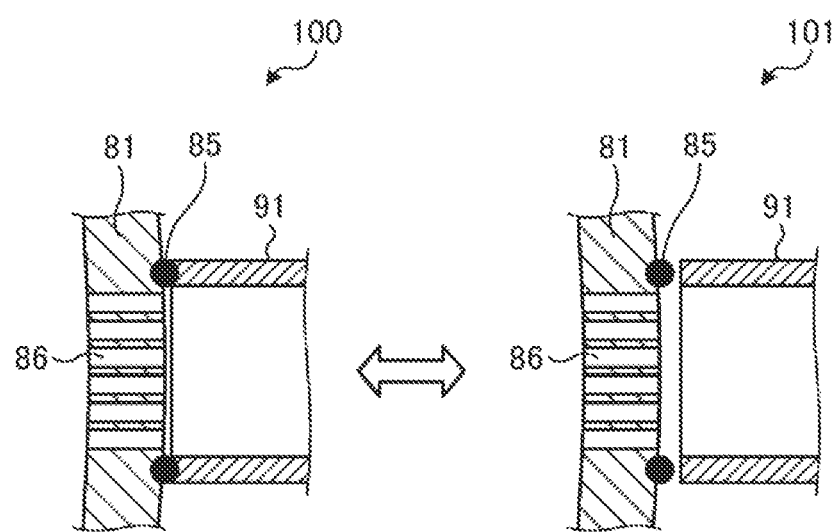
FIG. 4 is a view illustrating an exemplary arrangement of an O-ring between the shield member and the sleeve in the present embodiment.

FIG. 4 is a view illustrating an exemplary arrangement of an O-ring between the shield member and the sleeve in the present embodiment. FIG. 4 illustrates a state 100 in which the sleeve 91 is in contact with the valve body 81 and a state 101 in which the sleeve 91 is separated from the valve body 81 in the case of the surface-contact type in which the O-ring 85 is disposed on the valve body 81. As illustrated in a state 100, when the sleeve 91 is in contact with the valve body 81 via the O-ring 85, the plasma generation space S, the holes 86 and the internal space of the sleeve 91 are sealed. Meanwhile, as illustrated in a state 101, when the sleeve 91 is separated from the valve body 81 and is not in contact with the O-ring 85, the plasma generation space S, the holes 86 and the internal space of the sleeve 91 are not sealed, but communicate with the exhaust space E.

Figure 5:
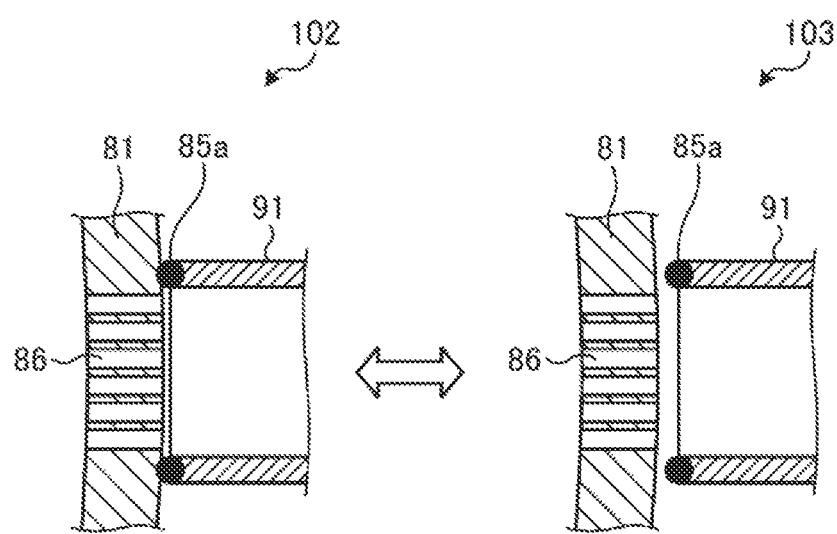
FIG. 5 is a view illustrating other exemplary arrangement of the O-ring between the shield member and the sleeve in the present embodiment.

The O-ring 85 may be provided on the sleeve 91, and this case will be described with reference to FIG. 5. FIG. 5 is a view illustrating another exemplary arrangement of the O-ring between the shield member and the sleeve in the present embodiment. FIG. 5 illustrates a state 102 in which the sleeve 91 is in contact with the valve body 81 and a state 103 in which the sleeve 91 is separated from the valve body 81 in the case of the surface-contact type in which the O-ring 85a is disposed on the sleeve 91. In FIG. 5, the O-ring 85a is installed on the tip of the sleeve 91 using adhesion, welding, chemical vapor deposition (CVD), or the like. As illustrated in the state 102, when the O-ring 85a provided at the end portion of the sleeve 91 is in contact with the valve body 81, the plasma generation space 5, the holes 86 and the internal space of the sleeve 91 are sealed. Meanwhile, as illustrated in the state 103, when the sleeve 91 is separated from the valve body 81 and the O-ring 85a is not in contact with the valve body 81, the plasma generation space S, the holes 86 and the internal space of the sleeve 91 are not sealed, but communicate with the exhaust space E.

Operation of Sleeve Drive Mechanism 90

Figure 6:
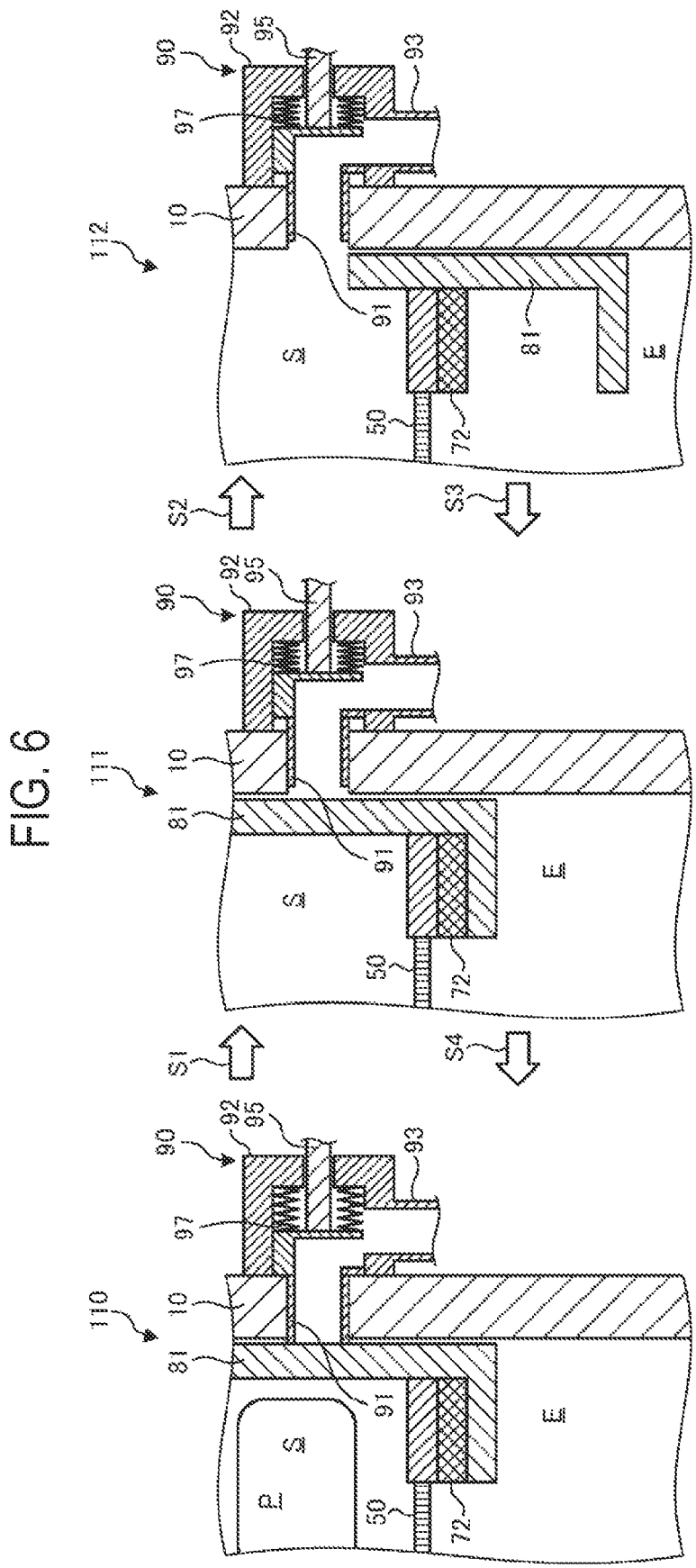
FIG. 6 is a view illustrating an exemplary operation of the sleeve drive mechanism in the present embodiment.

Next, the movement of the valve body 81 and the sleeve 91 will be described with reference to FIG. 6. FIG. 6 is a view illustrating an exemplary operation of the sleeve drive mechanism in the present embodiment. As illustrated in a state 110 of FIG. 6, during a process, that is, in a state in which the plasma P is generated in the plasma generation space S of the chamber 10, the sleeve 91 comes into contact with the valve body 81, and the pressure in the plasma generation space S is transmitted to the capacitance manometer 94 via the sleeve 91, the pipe 93, and the like.

When the process is completed, the controller 5 drives the sleeve 91 outwardly of the chamber 10, as illustrated in a state 111 (step S1). The controller 5 detects the operation of the sleeve 91 using a sensor (not illustrated) provided in the drive mechanism 92. A state 111 is a standby state before a wafer W to be processed is unloaded. At this time, the pressure measured by the capacitance manometer 94 is the pressure inside the chamber 10 including the plasma generation space S and the exhaust space E. That is, the capacitance manometer 94 is able to monitor the pressure in the chamber 10 even while adjusting the pressure during transport.

When the pressure adjustment for transporting the wafer W is completed, the controller 5 lowers the valve body 81 and opens the gate valve 52 as illustrated in a state 112, and the wafer W is unloaded from the opening 51 (step S2). The capacitance manometer 94 may monitor the pressure in the chamber 10 even during unloading.

When the unloading of the wafer W is completed, the controller 5 closes the gate valve 52 and raises the valve body 81 after the water W to be processed next is loaded (step S3).

When the raising of the valve body 81 is completed, the controller 5 drives the sleeve 91 inwardly of the chamber 10 and brings the end portion of the sleeve 91 into contact with the valve body 81 (step S4). When the end portion of the sleeve 91 comes into contact with the valve body 81, the controller 5 controls the APC valve 48 and the TMP 49 while monitoring the pressure in the plasma generation space S using the capacitance manometer 94 such that the pressure in the plasma generation space S becomes a predetermined pressure. When the pressure becomes a pressure appropriate for the process, the controller generates plasma and executes the process. As described above, in the present embodiment, when the pressure in the plasma generation space S is measured, the movable sleeve 91 is brought into contact with the valve body 81 which is a shield member. Thus, it is possible to separate the plasma generation space S from the exhaust space E. That is, it is possible to accurately measure a pressure even at a driving location. Further, since it is possible to install a plurality of pressure gauges without considering the driving locations, it is possible to measure a pressure distribution in the chamber 10.

Method of Driving Sleeve 91

Figure 7:
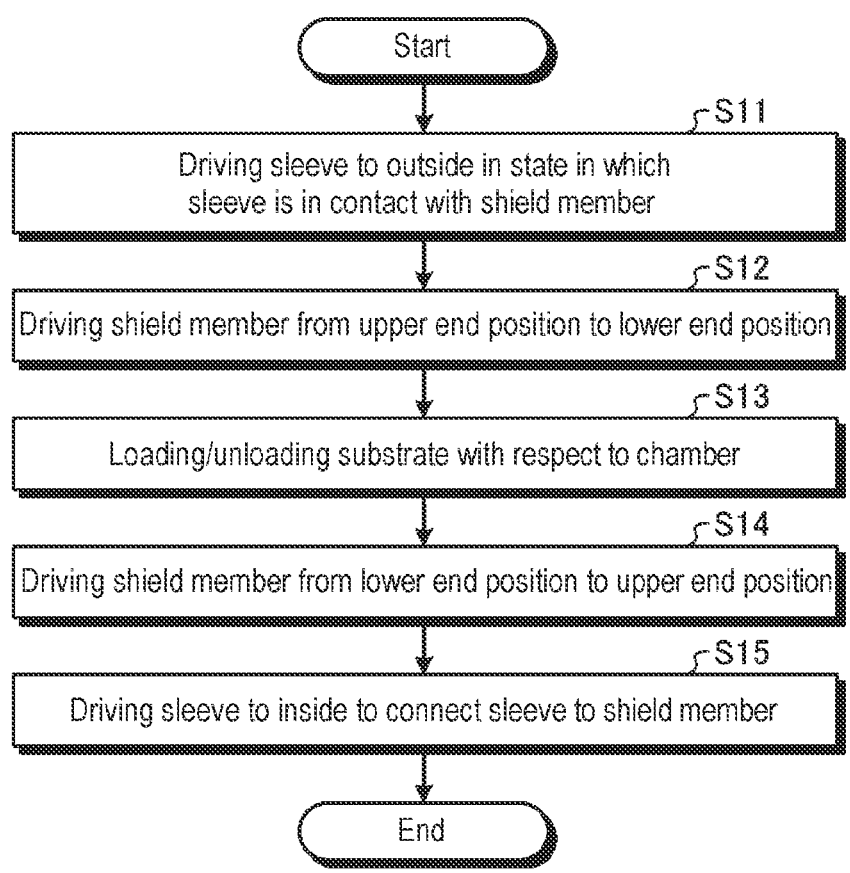
FIG. 7 is a flowchart illustrating an exemplary sleeve drive process in the present embodiment.

Subsequently, a method of driving the sleeve 91 will be described with reference to FIG. 7. FIG. 7 is a flowchart illustrating an exemplary sleeve drive process in the present embodiment.

First, in a state in which the end portion of the sleeve 91 on the inward side of the chamber 10 is in contact with the shield member (the valve body 81), the controller 5 drives the sleeve 91 outwardly of the chamber 10 so as to separate the sleeve 91 from the body 81 (step S11).

The controller 5 drives the shield member (the valve body 81) from the upper end position to the lower end position (step S12). The controller 5 loads a wafer W into the chamber 10 or unloads the wafer W from the chamber 10 (step S13). The controller 5 drives the shield member (the valve body 81) from the lower end position to the upper end position (step S14). The controller 5 drives the sleeve 91 toward the center of the chamber 10 and connects the end portion of the sleeve 91 on the inward side of the chamber 10 to the shield member (the valve body 81) (step S15). As described above, in the present embodiment, since the sleeve 91 for pressure measurement is brought into contact or separated according to driving of the shield member (the valve body 81), it is possible to accurately measure the pressure even at a driving location such as the valve body 81.

Each Modification of Sleeve Drive Mechanism 90

In the above embodiment, the bellows 97 is provided on the flange of the drive shaft 95, and the drive part 96 is provided outside the drive mechanism 92 to drive the sleeve 91 in the horizontal direction. However, other structures may be used, and the embodiment in such cases will be described as Modifications 1 to 3. Since the plasma processing apparatus in Modifications 1 to 3 is the same as the plasma processing apparatus 1 of the above-described embodiment, redundant descriptions of configuration and operation thereof will be omitted.

Figure 8:
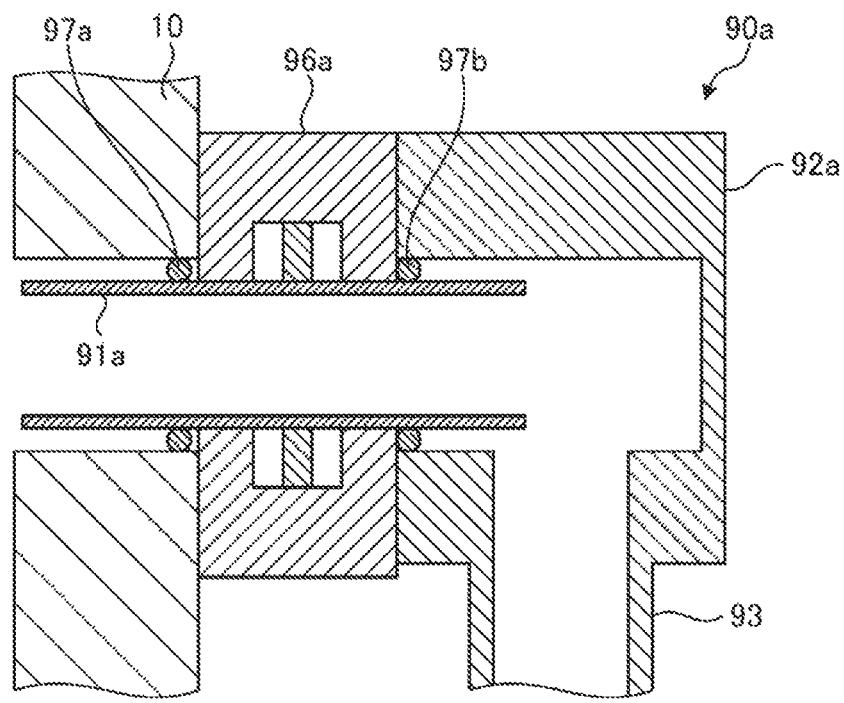
FIG. 8 is a partial enlarged view illustrating an exemplary cross section of the sleeve drive mechanism in Modification 1.

FIG. 8 is a partial enlarged view illustrating an exemplary cross section of the sleeve drive mechanism in Modification 1. As illustrated in FIG. 8, the sleeve drive mechanism 90*a* in Modification 1 has a sleeve 91*a*, a connection part 92*a*, a drive part 96*a*, and shaft seals 97*a* and 97*b*, instead of the sleeve 91, the drive mechanism 92, the drive shaft 95, the drive part 96, and the bellows 97, compared with the embodiment. The central portion of the sleeve 91*a* is connected to the air cylinder of the drive part 96*a*, and the sleeve 91*a* is driven in the horizontal direction according to the movement of the air cylinder. The connection part 92*a* connects the drive part 96*a* and the pipe 93 to each other. In addition, the space inside the connection part 92*a* is a space that is capable of accommodating the end portion of the sleeve 91*a* in the outward direction of the chamber 10 when the sleeve 91*a* is driven in the outward direction of the chamber 10. The drive part 96*a* drives the sleeve 91*a* using an air cylinder. The shaft seals 97*a* and 97*b* seal the spaces communicating with the inside of the sleeve 91*a* on a side of the drive part 96*a* facing the side wall of the chamber 10 and on a side of the drive part 96*a* facing the connection part 92*a*.

Figure 9:
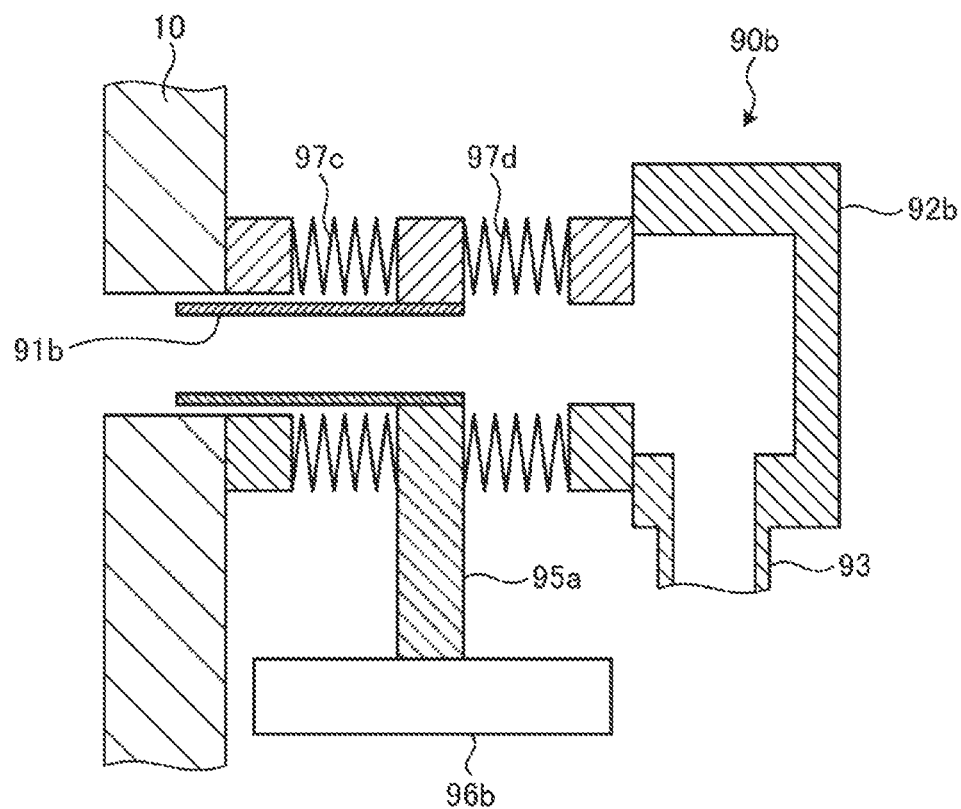
FIG. 9 is a partial enlarged view illustrating an exemplary cross section of the sleeve drive mechanism in Modification 2.

FIG. 9 is a partial enlarged view illustrating an exemplary cross section of the sleeve drive mechanism in Modification 2. As illustrated in FIG. 9, compared with that in the embodiment, the sleeve drive mechanism 90*b* in Modification 2 has a sleeve 91*b*, a connection part 92*b*, a drive shaft 95*a*, a driving part 96*b*, and bellows 97*c* and 97*d*, instead of the sleeve 91, the drive mechanism 92, the drive shaft 95, the drive part 96, and the bellows 97. An end of the sleeve 91*b* facing outwardly of the chamber 10 is connected to the drive shaft 95*a*, and the sleeve 91*b* is driven in the horizontal direction in accordance with the movement of the drive shaft 95*a* by the drive part 96*b*. The connection part 92*b* connects the bellows 97*d* and the pipe 93 to each other. The drive shaft 95*a* is disposed substantially parallel to the side wall of the chamber 10, and a sleeve 91*b* penetrates one end portion of the drive shaft 95*a*, so that the sleeve 91*b* is connected to and held by the sleeve 91*b* at a right angle. The other end portion of the drive shaft 95*a* is connected to the drive part 96*b*. The drive part 96*b* drives the sleeve 91*b* and the drive shaft 95*a* in the horizontal direction by sliding the end portion of the drive shaft 95*a* inwardly and outwardly of the chamber 10. The bellows 97*c* and 97*d* are formed to be expandable/contractible. The bellows 97*c* connects a side of the drive shaft 95*a* facing inwardly of the chamber 10 to the outer wall of the chamber 10. The bellows 97*d* connects a side of the drive shaft 95*a* facing outwardly of the chamber 10 to the connection part 92*b*. The bellows 97*c* and 97*d* seal the space communicating with the inside of the sleeve 91*b*.

Figure 10:
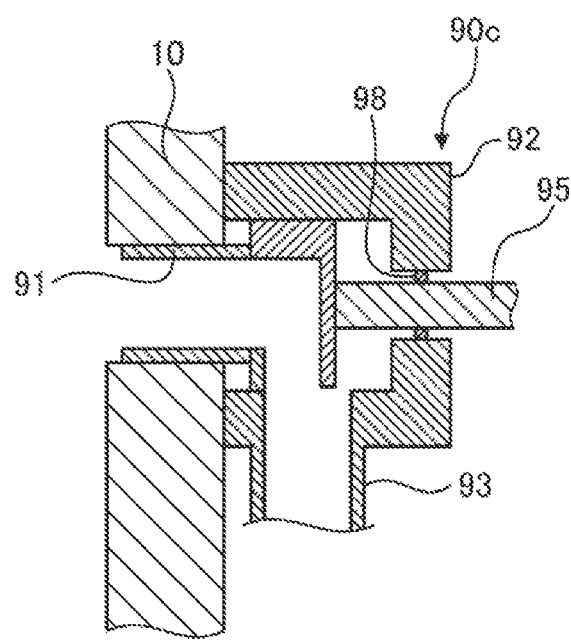
FIG. 10 is a partial enlarged view illustrating an exemplary cross section of the sleeve drive mechanism in Modification 3.

FIG. 10 is a partial enlarged view illustrating an exemplary cross section of the sleeve drive mechanism in Modification 3. As illustrated in FIG. 10, the sleeve drive mechanism 90*c* in the third modification has a shaft seal 98 instead of the bellows 97 compared with the embodiment. The shaft seal 98 seals the space between the drive shaft 95 and the drive mechanism 92. That is, the shaft seal 98 seals the space communicating with the inside of the sleeve 91.

In the sleeve drive mechanisms 90*a*, 90*b*, and 90*c* of Modifications 1 to 3, the sleeves 91*a*, 91*b*, and 91 are brought into contact with or separated from the shield member according to driving of the shield member (the valve body 81), similar to the sleeve drive mechanism 90 of the embodiment. Therefore, it is possible to accurately measure the pressure even at a driving location such as the valve body 81.

Each Modification of Contact Surface Between Shield Member and Sleeve

In the embodiment described above, the sleeve 91 is brought into contact with the wall surface of the shield member (the valve body 81) via the O-ring 85, but a recess into which the end portion of the sleeve 91 is insertable may be formed in the wall surface of the shield member (the valve body 81). The embodiments in this case will be described as Modifications 4 to 7. Since the plasma processing apparatus in Modifications 4 to 7 is the same as the plasma processing apparatus 1 of the embodiment described above, redundant descriptions of the configuration and operation thereof will be omitted.

Figure 11:
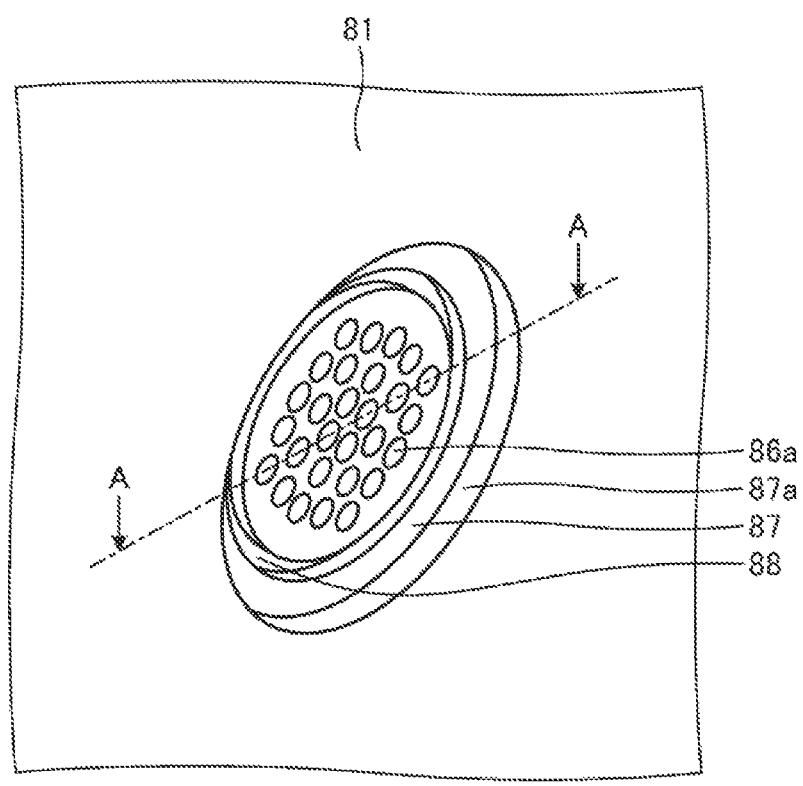
FIG. 11 is a view illustrating an exemplary sleeve contact surface of the shield member in Modifications 4 to 7.

FIG. 11 is a view illustrating an exemplary sleeve contact surface of the shield member in Modifications 4 to 7. As illustrated in FIG. 11, a recess 87 is provided on the surface of the valve body 81, which is a shield member, with which the sleeve 91 comes into contact. A plurality of holes 86*a* are provided in the bottom surface of the recess 87. Further, a groove 88 for fitting an O-ring thereinto is provided in the bottom surface of the recess 87. The groove 88 is not necessary when the O-ring is provided on the end side of the sleeve 91. The holes 86*a* allow the plasma generation space S side of the valve body 81 to communicate with the exhaust space E side. When the sleeve 91 is inserted into the recess 87 and comes into close contact with the valve body 81 via the O-ring, the plasma generation space S and the space inside the sleeve 91 are connected with each other and separated from the exhaust space E. In the case of the surface-contact type in which the O-ring is provided in the groove 88 or on the end portion of the sleeve 91, there is a gap between the side surface 87*a* of the recess 87 and the sleeve 91. In the following Modifications 4 to 7, the cross sections of the shield member (the valve body 81), the O-ring, and the sleeve 91 taken along line A-A are illustrated as FIGS. 12 to 15. In each of the drawings below, the deformation of the O-ring is not indicated.

Figure 12:
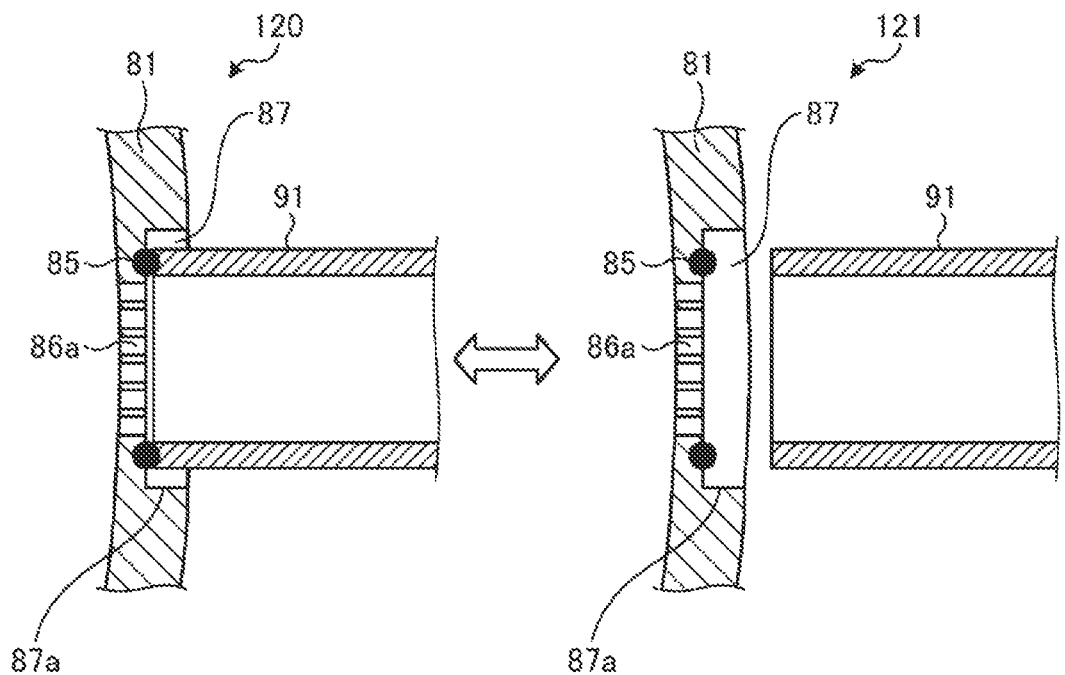
FIG. 12 is a view illustrating an exemplary arrangement of the O-ring between the shield member and the sleeve in Modification 4.

FIG. 12 is a view illustrating an exemplary arrangement of the O-ring between the shield member and the sleeve in Modification 4. Modification 4 is an exemplary surface-contact type in which a recess 87 is provided. FIG. 12 illustrates a state 120 in which the sleeve 91 is inserted into the recess 87 and a state 121 in which the sleeve 91 is pulled out in the case where the O-ring 85 is fitted into the groove 88 and disposed on the valve body 81 side. As illustrated in the state 120, when the sleeve 91 is in contact with the bottom portion of the recess 87 via the O-ring 85, the plasma generation space S, the holes 86*a* and the internal space of the sleeve 91 are sealed. Meanwhile, as illustrated in the state 121, when the sleeve 91 is pulled out from the recess 87 and is not in contact with the O-ring 85, the plasma generation space S, the holes 86*a* and the internal space of the sleeve 91 are not sealed, but communicate with the exhaust space E.

Figure 13:
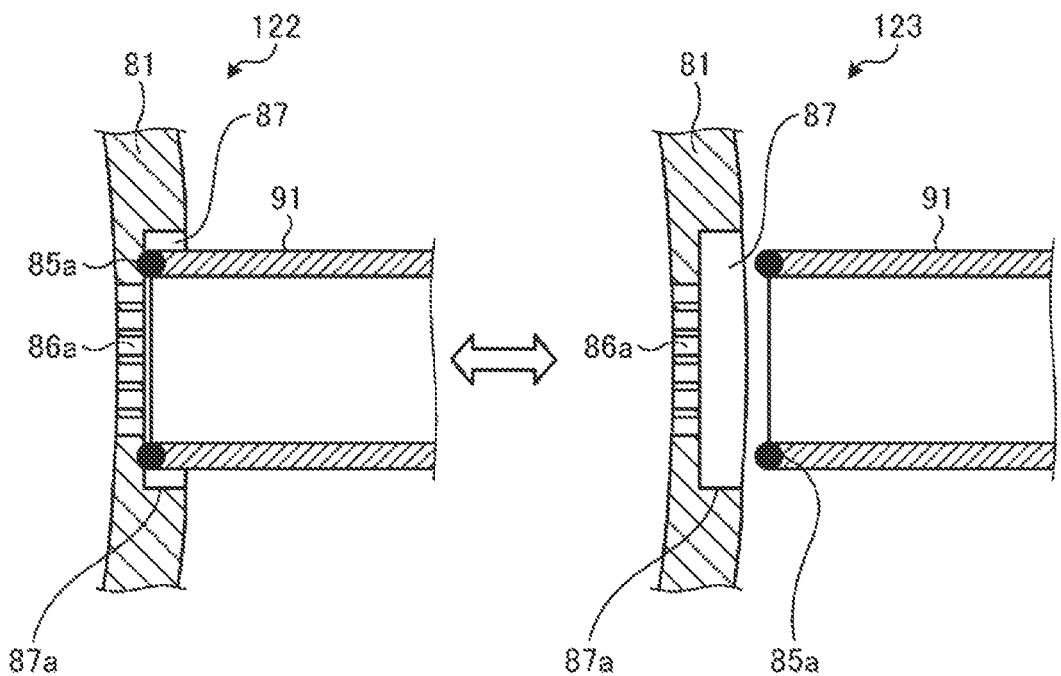
FIG. 13 is a view illustrating an exemplary arrangement of the O-ring between the shield member and the sleeve in Modification 5.

FIG. 13 is a view illustrating an exemplary arrangement of the O-ring between the shield member and the sleeve in Modification 5. Modification 5 is an exemplary surface-contact type in which a recess 87 is provided. FIG. 13 illustrates a state 122 in which the sleeve 91 is inserted into the recess 87 and a state 123 in which the sleeve 91 is pulled out in the case where the O-ring 85*a* is arranged on the sleeve 91 side. In FIG. 13, the O-ring 85*a* is attached to the tip of the sleeve 91 through adhesion, welding, CVD, or the like. In FIG. 13, the recess 87 is not provided with a groove 88. As illustrated in the state 122, when the O-ring 85*a* provided on the end portion of the sleeve 91 is in contact with the bottom portion of the recess 87, the plasma generation space S, the holes 86*a* and the internal space of the sleeve 91 are sealed. Meanwhile, as illustrated in the state 123, when the sleeve 91 is pulled out from the recess 87 and the O-ring 85*a* is not in contact with the bottom portion of the recess 87, the plasma generation space S, the holes 86a and the internal space of the sleeve 91 are not sealed, but communicate with the exhaust space E.

Figure 14:
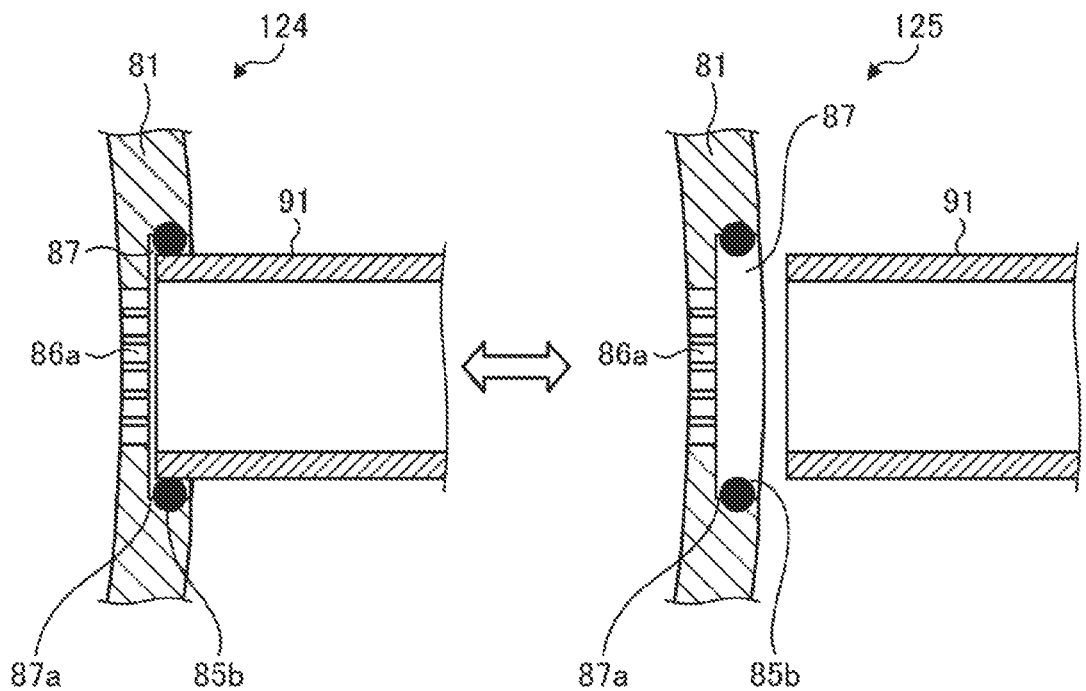
FIG. 14 is a view illustrating an exemplary arrangement of the O-ring between the shield member and the sleeve in Modification 6.

FIG. 14 is a view illustrating an exemplary arrangement of the O-ring between the shield member and the sleeve in Modification 6. Modification 6 is an exemplary shaft seal type in which a recess 87 is provided. FIG. 14 illustrates a state 124 in which the sleeve 91 is inserted into the recess 87 and a state 125 in which the sleeve 91 is pulled out in the case where the O-ring 85b is disposed on the side surface 87a of the recess 87. In FIG. 14, the recess 87 is not provided with a groove 88. As illustrated in the state 124, when the sleeve 91 is inserted into the recess 87 and the O-ring 85b is in contact with the end side surface of the sleeve 91, the plasma generation space S, the holes 86a and the internal space of the sleeve 91 are sealed. Meanwhile, as illustrated in the state 125, when the sleeve 91 is pulled out from the recess 87 and the O-ring 85b is not in contact with the end side surface of the sleeve 91, the plasma generation space S, the holes 86a and the internal space of the sleeve 91 are not sealed, but communicate with the exhaust space E.

Figure 15:
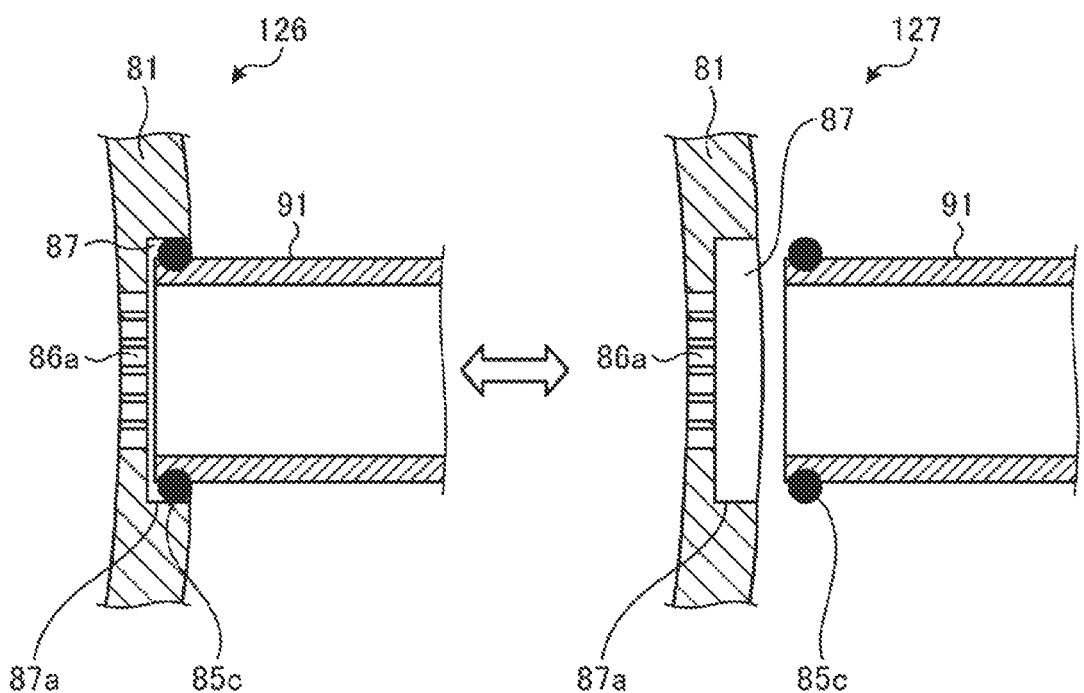
FIG. 15 is a view illustrating an exemplary arrangement of the O-ring between the shield member and the sleeve in Modification 7.

FIG. 15 is a view illustrating an exemplary arrangement of the O-ring between the shield member and the sleeve in Modification 7. Modification 7 is an exemplary shaft seal type in which a recess 87 is provided. FIG. 15 illustrates a state 126 in which the sleeve 91 is inserted into the recess 87 and a state 127 in which the sleeve 91 is pulled out in the case where the O-ring 85c is disposed on the end side surface of the sleeve 91. In FIG. 15, the O-ring 85c is fitted in a groove (not illustrated) provided in the end side surface of the sleeve 91, or is installed through adhesion, welding, CND, or the like. In FIG. 15, the recess 87 is not provided with a groove 88. As illustrated in the state 126, when the O-ring 85c provided on the end side surface of the sleeve 91 is in contact with the side surface 87a of the recess 87, the plasma generation space S, the holes 86a and the internal space of the sleeve 91 are sealed. Meanwhile, as illustrated in the state 127, when the sleeve 91 is pulled out from the recess 87 and the O-ring 85c is not in contact with the side surface 87a of the recess 87, the plasma generation space S, the holes 86a and the internal space of the sleeve 91 are not sealed, but communicate with the exhaust space E. In Modifications 4 to 7, the conductance of the hole 86a becomes larger than (improved compared to) that of the hole 86 of the embodiment by providing the recess 87 in the valve body 81.

Each Modification in which End Portion of Sleeve is Insertable Into Shield Member In Modifications 4 to 7, a recess 87 is provided in the contact surface of the valve body 81 with the sleeve 91. However, the valve body 81 may be provided with a through hole through which the sleeve is insertable, and the tip of the sleeve may be made in a container shape and may be exposed to the plasma generation space S. The embodiments in this case will be described as Modifications 8 to 12. Since the plasma processing apparatus in Modifications 8 to 12 is the same as the plasma processing apparatus 1 of the embodiment described above, redundant descriptions of the configuration and operation thereof will be omitted.

Figure 16:
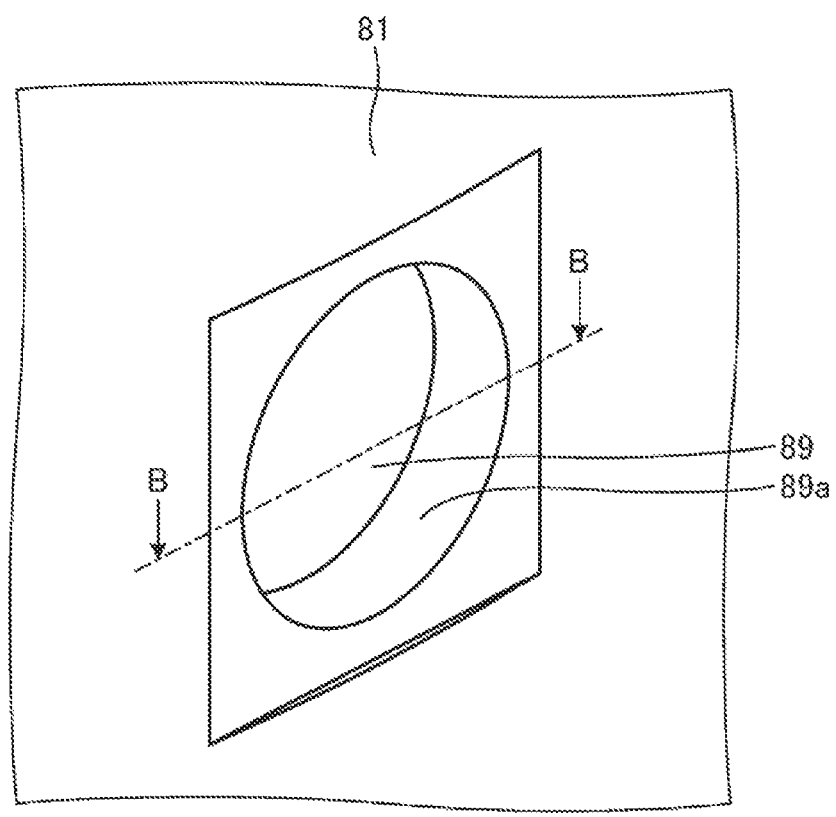
FIG. 16 is a view illustrating an exemplary sleeve contact surface of the shield member in Modifications 8 to 12.

FIG. 16 is a view illustrating an exemplary sleeve contact surface of the shield member in Modifications 8 to 12. As illustrated FIG. 16, a through hole 89 into which the sleeve is inserted is provided in the surface of the valve body 81, which is a shield member. In FIG. 16, the wall surface in which the through hole 89 is provided is processed so as to be flat, and the through hole 89 is opened such that the side surface 89a is substantially perpendicular to the flat surface. Further, in the following Modifications 8 to 12, cross sections of the shield member (the valve body 81), the O-ring, and the sleeve taken along line B-B are illustrated as FIGS. 17 to 20 and 23. In each of the drawings below, the deformation of the O-ring is not indicated.

Figure 17:
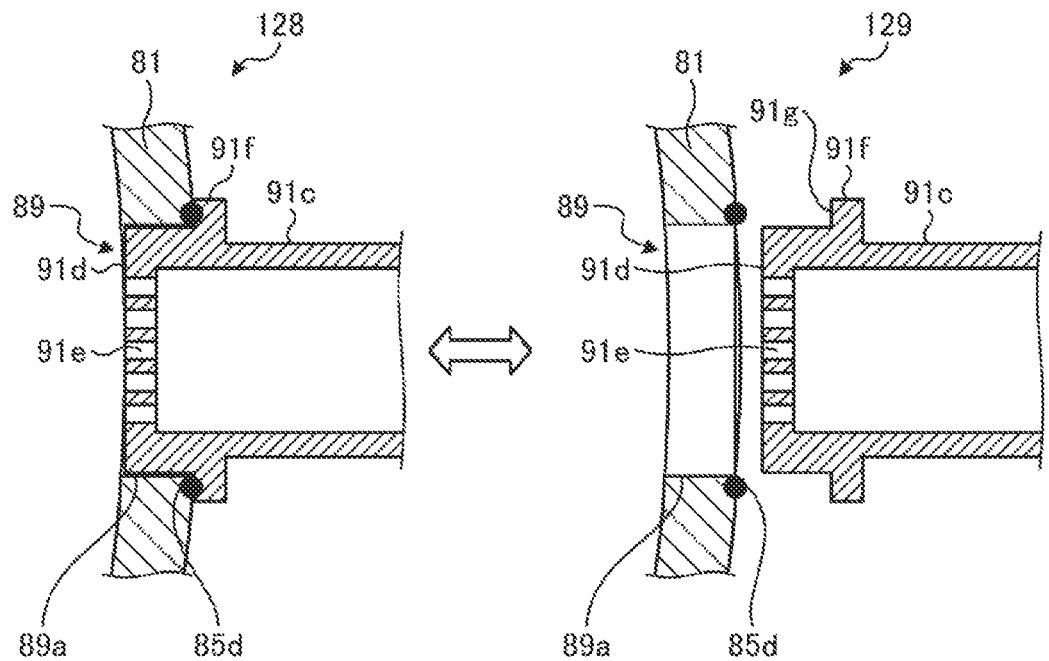
FIG. 17 is a view illustrating an exemplary arrangement of the O-ring between the shield member and the sleeve in Modification 8.

FIG. 17 is a view illustrating an exemplary arrangement of the O-ring between the shield member and the sleeve in Modification 8. Modification 8 is an exemplary surface-contact type in the case where a through hole 89 is provided. FIG. 17 illustrates a state 128 in which the sleeve 91c is inserted into the through hole 89 and a state 129 in which the sleeve 91c is pulled out in the case where the O-ring 85d is arranged around the through hole 89 in the valve body 81. In the sleeve 91c illustrated in FIG. 17, a surface 91d is provided such that the tip portion of the sleeve 91c has a container shape. In addition, the surface 91d is provided with a plurality of holes 91e. The sleeve 91c is further provided with a stopper 91f such that the sleeve 91c is not inserted into the chamber 10 beyond a predetermined amount or more when the sleeve 91c is inserted into the through hole 89 in the valve body 81. The stopper 91f is configured such that a surface 91g of the leading end thereof is in contact with the O-ring 85d.

As illustrated in the state 128, when the surface 912 of the sleeve 91c and the O-ring 85d are in contact with each other, the plasma generation space S, the holes 91e and the internal space of the sleeve 91c are sealed. Meanwhile, as illustrated in the state 129, when the sleeve 91c is pulled out from the through hole 89 and the O-ring 85d is not in contact with the surface 91g, the plasma generation space S, the holes 91e and the internal space of the sleeve 91c are not sealed, but communicate with the exhaust space E.

Figure 18:
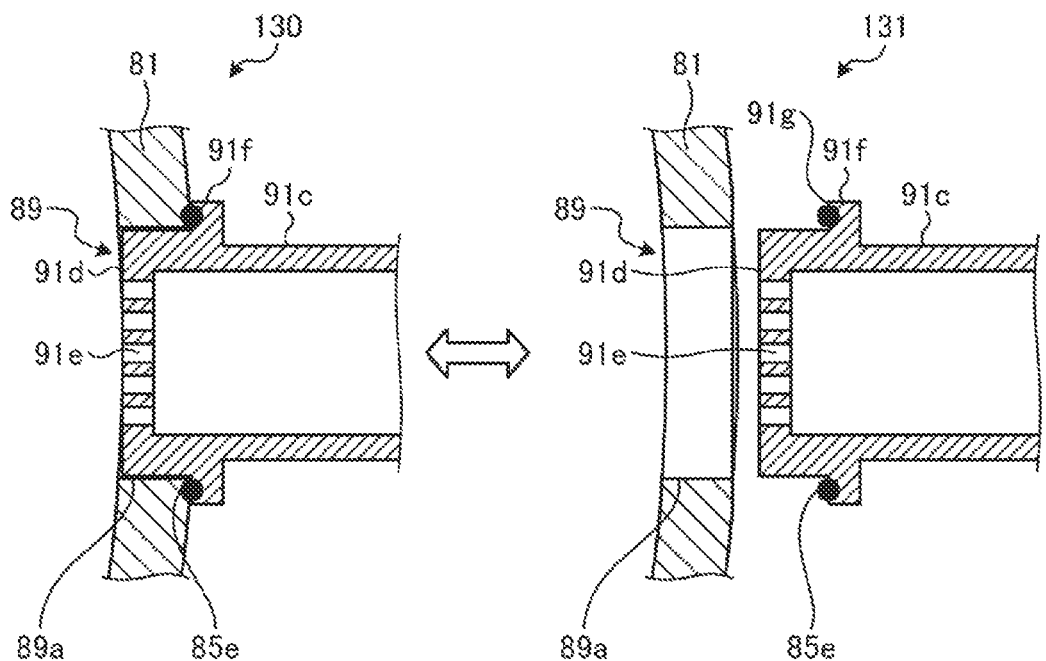
FIG. 18 is a view illustrating an exemplary arrangement of the O-ring between the shield member and the sleeve in Modification 9.

FIG. 18 is a view illustrating an exemplary arrangement of the O-ring between the shield member and the sleeve in Modification 9. Modification 9 is an exemplary surface-contact type in the case where a through hole 89 is provided. The sleeve 91c of Modification 9 has a surface 91d, holes 91e, a stopper 91f, and a surface 91g as in Modification 8. FIG. 18 illustrates a state 130 in which the sleeve 91c is inserted into the through hole 89 and a state 131 in which the sleeve 91c is pulled out in the case where the O-ring 85e is disposed on the surface 91g of the stopper 91f. In FIG. 18, the O-ring 85e is fitted into a groove (not illustrated) provided in the surface 91g, or is installed through adhesion, welding, CVD, or the like.

As illustrated in the state 130, when the periphery of the through hole 89 and the O-ring 85e are in contact with each other, the plasma generation space S, the holes 91e and the internal space of the sleeve 91c are sealed. Meanwhile, as illustrated in the state 131, when the sleeve 91c is pulled out from the through hole 89 and the O-ring 85e is not in contact with the periphery of the through hole 89, the plasma generation space S, the holes 91e and the internal space of the sleeve 91c are not sealed, but communicate with the exhaust space E.

Figure 19:
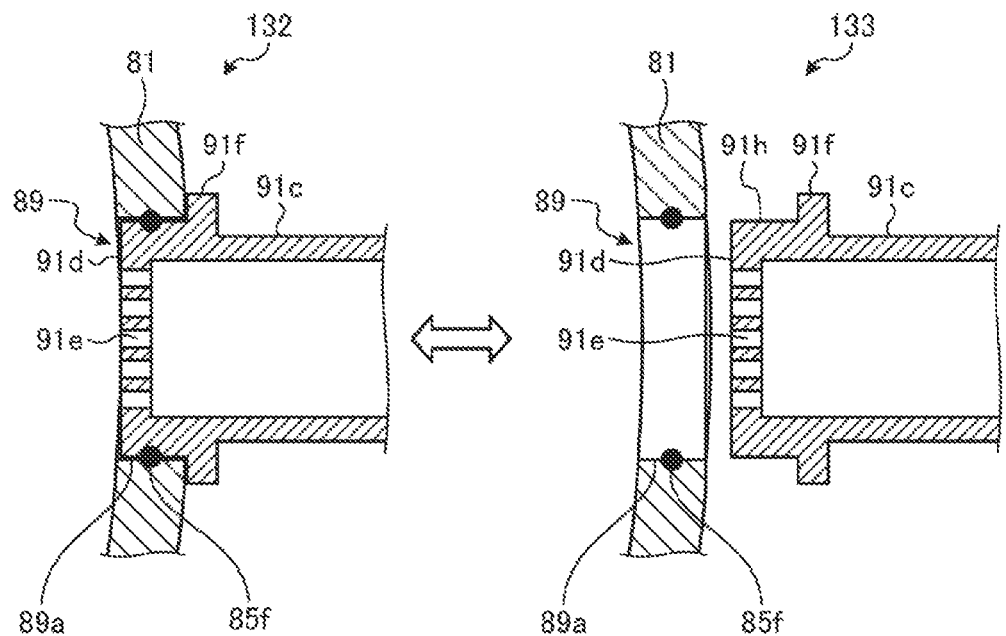
FIG. 19 is a view illustrating an exemplary arrangement of the O-ring between the shield member and the sleeve in Modification 10.

FIG. 19 is a view illustrating an exemplary arrangement of the O-ring between the shield member and the sleeve in Modification 10. Modification 10 is an exemplary shall seal type in the case where a through hole 89 is provided. The sleeve 91c of Modification 10 has a surface 91d, holes 91e, and a stopper 91f, as in Modification 8. FIG. 19 illustrates a state 132 in which the sleeve 91c is inserted into the through hole 89 and a state 133 in which the sleeve 91c is pulled out in the case where the O-ring 85f is disposed on the side surface 89a of the through hole 89. In FIG. 19, the O-ring 85*f* is fitted into a groove (not illustrated) provided in the side surface 89*a*, or is installed through adhesion, welding, CVD, or the like.

As illustrated in the state 132, when the end side surface 91*h* of the sleeve 91*c* and the O-ring 85*f* are in contact with each other, the plasma generation space S, the holes 91*e* and the internal space of the sleeve 91*c* are sealed. Meanwhile, as illustrated in the state 133, when the sleeve 91*c* is pulled out from the through hole 89 and the O-ring 85*f* is not in contact with the end side surface 91*h* of the sleeve 91*c*, the plasma generation space S, the holes 91*e* and the internal space of the sleeve 91*c* are not sealed, but communicate with the exhaust space E.

Figure 20:
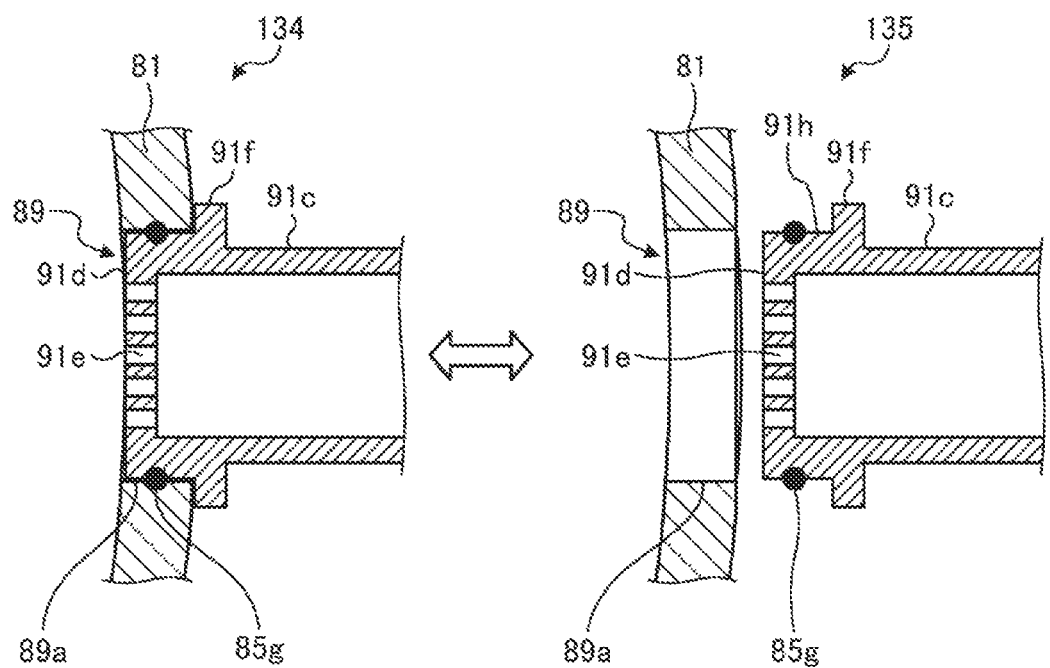
FIG. 20 is a view illustrating an exemplary arrangement of the O-ring between the shield member and the sleeve in Modification 11.

FIG. 20 is a view illustrating an exemplary arrangement of the O-ring between the shield member and the sleeve in Modification 11. Modification 11 is an exemplary shaft seal type in the case where a through hole 89 is provided. The sleeve 91*c* of Modification 11 has a surface 91*d*, holes 91*e*, and a stopper 91*f*, as in Modification 8. FIG. 20 illustrates a state 134 in which the sleeve 91*c* is inserted into the through hole 89 and a state 135 in which the sleeve 91*c* is pulled out in the case where the O-ring 85*g* is disposed on the end side surface 91*h* of the sleeve 91*c*. In FIG. 20, the O-ring 85*g* is fitted into a groove (not illustrated) provided in the end side surface 91*h* of the sleeve 91*c*, or is installed through adhesion, welding, CVD, or the like.

As illustrated in the state 134, when the side surface 89*a* of the through hole 89 and the O-ring 85*g* are in contact with each other, the plasma generation space S, the holes 91*e* and the internal space of the sleeve 91*c* are sealed with respect to the exhaust space E. Meanwhile, as illustrated in the state 135, when the sleeve 91*c* is pulled out from the through hole 89 and the O-ring 85*g* is not in contact with the side surface 89*a* of the through hole 89, the plasma generation space S, the holes 91*e* and the internal space of the sleeve 91*c* are not sealed, but communicate with the exhaust space E.

Figure 21:
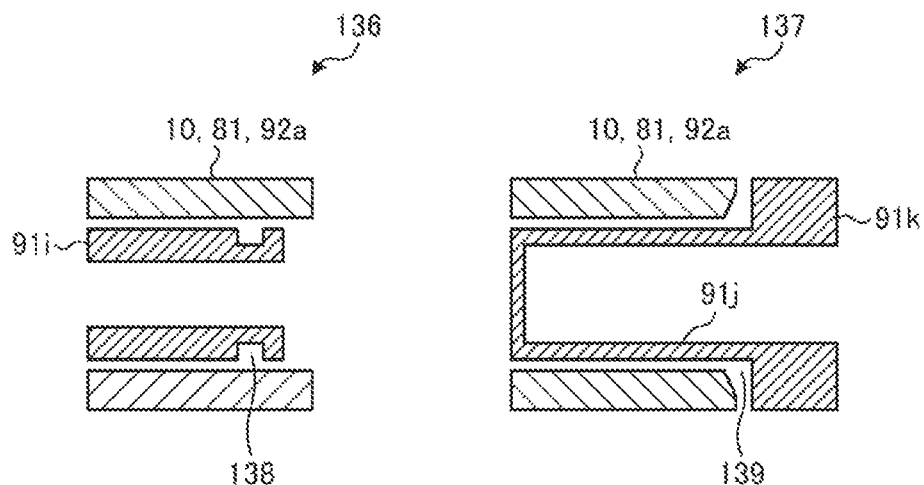
FIG. 21 is a view illustrating an exemplary method of holding an O-ring in the case of a shaft seal.

Here, a method of holding an O-ring in the case of a shaft seal will be described with reference to FIG. 21. FIG. 21 is a view illustrating an exemplary method of holding an O-ring in the case of a shaft seal. FIG. 21 illustrates O-ring holding methods 136 and 137. In the holding method 136, for example, an angular groove 138 is provided in a sleeve 91*i*, and the O-ring is held by the angular groove 138, whereby the sealed state is maintained between the sleeve 91*i* and counterparts, such as the chamber 10, the valve body 81, and the connection part 92*a*. When it is impossible to provide the angular groove 138, the O-ring is installed through adhesion, welding, CVD, or the like. In the holding method 137, for example, a flange 91*k* is provided on the end portion of the sleeve 91*j*, and an O-ring is held in a triangular groove 139 which is a contact portion between the flange 91*k* and the end portions of the counterparts, such as the chamber 10, the valve body 81, and the connecting portion 92*a*, whereby the sealed state is maintained.

Figure 22:
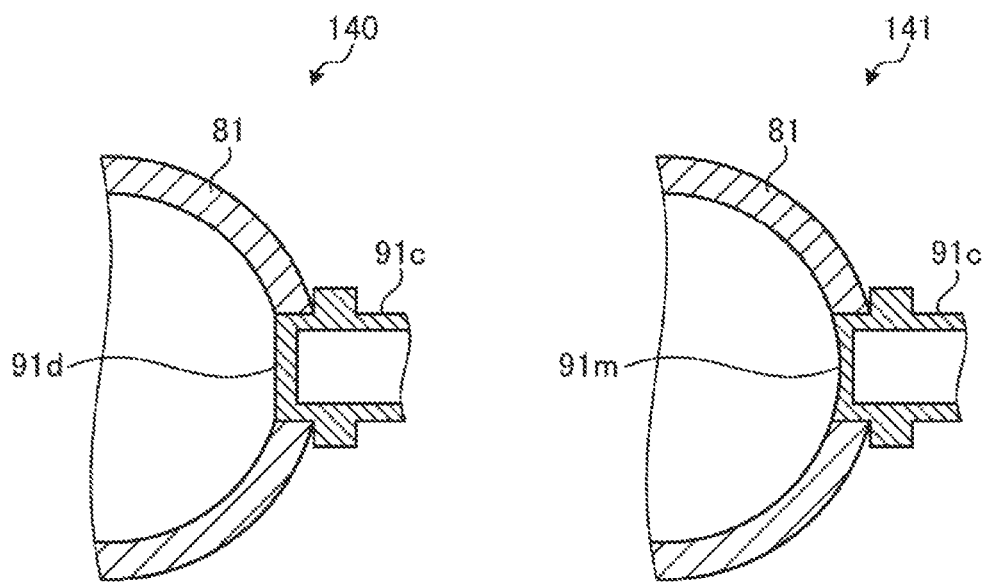
FIG. 22 is a view illustrating an exemplary shape of the tip portion of the sleeve.

Next, the shape of the tip portion of the sleeve 91*c* facing inwardly of the chamber 10 will be described with reference to FIG. 22. FIG. 22 is a view illustrating an exemplary shape of the tip portion of the sleeve. In FIG. 22, the R of the valve body 81, which is a shield member, is indicated with emphasis. FIG. 22 illustrates a states 140 and 141 of the shapes of the tip of the sleeve 91*c* in the case where the sleeve 91*c* is inserted into a through hole 89, as illustrated in Modifications 8 to 12. The state 140 indicates the case where the surface 91*d* at the tip of the sleeve 91*c* is flat, and a portion of the valve body 81, which is a shield member, is convex or concave in the circumferential direction. Meanwhile, in the state 141, since the surface 91*m* of the tip of the sleeve 91*c* is a curved surface that matches the R of the valve body 81, the portion that is in contact with the valve body 81 is a smooth curved surface. When the surface 91*m* illustrated in the state 141 is employed, it is possible more reduce the influence on the plasma generated in the plasma generation space S.

Figure 23:
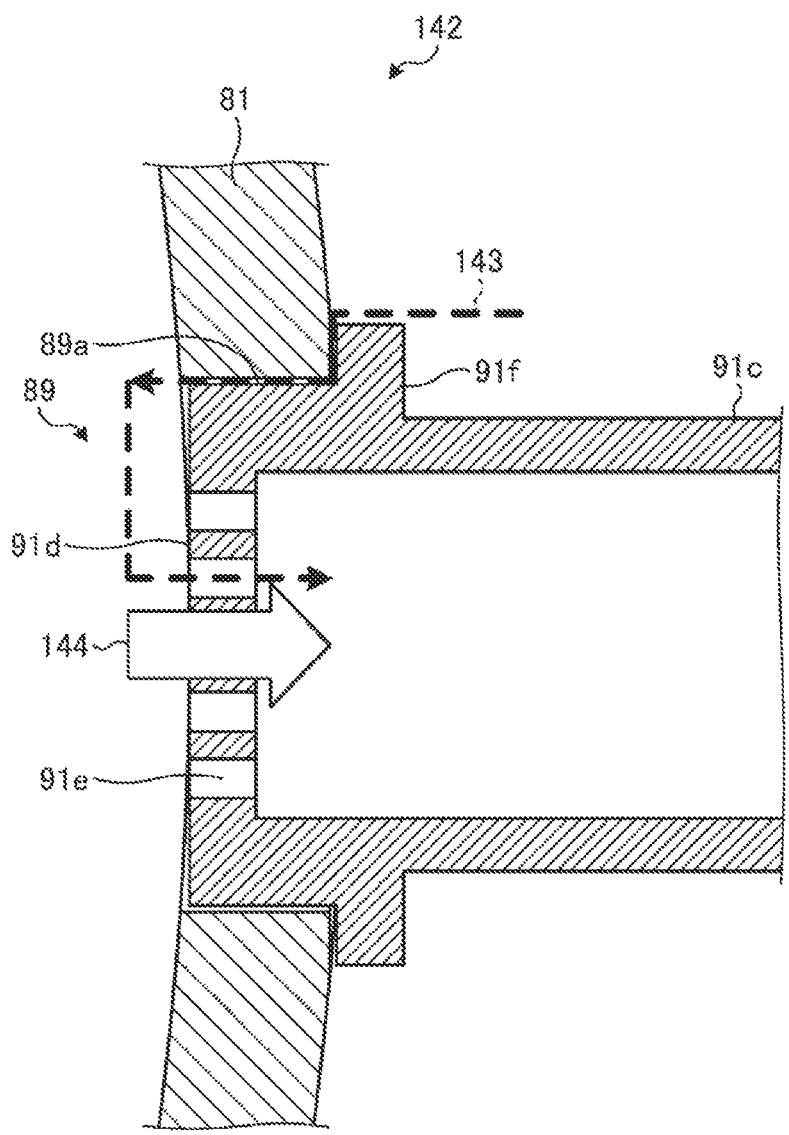
FIG. 23 is a view illustrating an exemplary connection between the shield member and the sleeve in Modification 12.

Next, a modification in which an O-ring is not used will be described with reference to FIGS. 23 and 24. FIG. 23 is a view illustrating an exemplary connection between the shield member and the sleeve in Modification 12. The sleeve 91*c* of Modification 12 has a surface 91*d*, holes 91*e*, and a stopper 91*f*, as in Modification 8. FIG. 23 illustrates a state 142 in which the sleeve 91*c* is inserted into a through hole 89 without using an O-ring.

As illustrated in the state 142, when the gap between the side surface 89*a* of the through hole 89 and the end side surface of the sleeve 91*c* is small, the disturbance from the exhaust space E illustrated in the path 143 is smaller than that in the path 144 reaching the inside of the sleeve 91 from the plasma generation space S through the holes 91*e*. That is, the conductance of the path 143 is smaller than that of the path 144. Therefore, the influence on pressure measurement by a capacitance manometer 94 is trivial.

Figure 24:
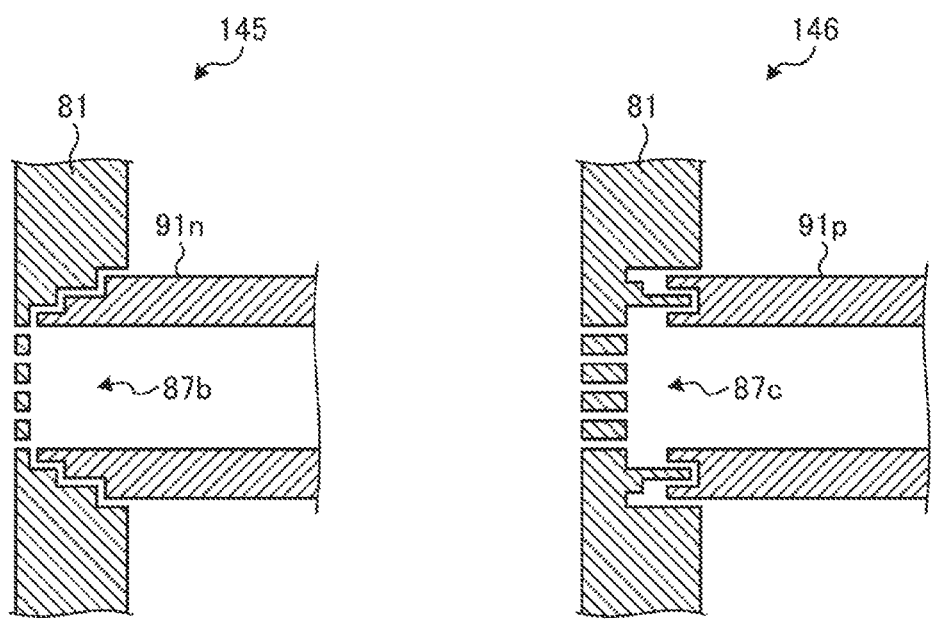
FIG. 24 is a view illustrating an exemplary connection between the shield member and the sleeve in Modification 13.

FIG. 24 is a view illustrating an exemplary connection between the shield member and the sleeve in Modification 13. FIG. 24 illustrates connection methods 145 and 146 that do not use other O-rings. In the connection method 145, a stepped recess 87*b* is provided in the valve body 81, and a sleeve 91*n* having a tip portion shaped to fit the recess 87*b* is used. In the connection method 146, a recess 87*c* having a ring-shaped protrusion on the outer peripheral portion thereof is provided in the valve body 81 and a sleeve 91*p* having a tip portion shaped to fit the ring-shaped protrusion of the recess 87*c* is used. In the connection methods 145 and 146, the recesses 87*b* and 87*c* provided in the wall surface of the shield member (the valve body 81) and the shapes of the end portions of the sleeves 91*n* and 91*p* are combined to form a labyrinth structure, whereby the disturbance from the exhaust space E, that is, the conductance, is reduced.

As described above, according to the present embodiment, the substrate processing apparatus (plasma processing apparatus 1) has a chamber 10, a shield member (a valve body 81), and a relay member (sleeve 91). The chamber 10 has a processing room (a plasma generation space S) configured to execute processing on a substrate using an introduced gas, and an exhaust room (exhaust space E) configured to exhaust the gas in the processing room. The shield member is provided at least in a part near the side wall of the chamber 10 so as to separate the processing room and the exhaust room from each other, and includes, in a portion of the wall surface parallel to the side wall of the chamber 10, holes 86 that allow the processing room and the exhaust room to communicate with each other. The shield member is capable of being driven in the vertical direction. The relay member is a hollow relay member connected to a pipe 93 connected to an instrument (a capacitance manometer 94) outside the chamber 10, and is capable of being driven in the horizontal direction, so that, when the shield member reaches the upper end position, the relay member is driven inwardly of the chamber and the end thereof facing inwardly of the chamber is connected to the shield member and allows the processing room and the pipe 93 to communicate with each other through the holes 86. As a result, it is possible to accurately measure a state (e.g., the pressure) in the processing room even at a driving location, such as the shield member.

In addition, according to the present embodiment, one or multiple holes 86 are provided in the wall surface, with which the relay member comes into contact, in a region narrower than the inner diameter of the relay member. As a result, it is possible to measure the pressure in the plasma generation space S using a pressure gauge (a capacitance manometer 94) outside the chamber 10.

In addition, according to Modifications 4 to 7, the shield member is provided with a recess 87, into which the end portion of the relay member facing inwardly of the chamber is insertable, in the external side of the wall surface with which the relay member comes into contact. As a result, it is possible to increase the conductance on the wall surface of the shield member.

In addition, according to Modifications 4 and 5, the relay member includes an O-ring 85 or 85a on the wall surface with which the relay member comes into contact or the end portion of the relay member facing inwardly of the chamber. Thus, when the end portion of the relay member facing inwardly of the chamber is in contact with the wall surface, the space between the processing room and the exhaust room is sealed with the O-ring 85 or 85a. As a result, it is possible to measure the pressure within the plasma generation space S using a pressure gauge outside the chamber 10.

According to Modifications 6 and 7, an O-ring 85b or 85c is provided on the side surface of the recess 87 or on the outside of the end portion of the relay member facing inwardly of the chamber. Thus, when the end portion of the relay member facing inwardly of the chamber is inserted into the recess 87, the space between the processing room and the exhaust room is sealed using the O-ring. As a result, it is possible to measure the pressure in the plasma generation space S using a pressure gauge outside the chamber 10.

In addition, according to Modifications 8 to 12, the hole is a through hole 89 into which the end portion of the relay member facing inwardly of the chamber is insertable. As a result, it is possible to measure the pressure in the plasma generation space S using a pressure gauge outside the chamber 10.

According to Modifications 8 to 12, the end surface (the surface 91d) of the end portion of the relay member facing inwardly of the chamber has a container shape, and the end surface has one or multiple holes 91e. As a result, it is possible to control the conductance by the relay member.

In addition, according to Modifications 8 to 12, the end portion of the relay member facing inwardly of the chamber has a stopper 91f that comes into contact with the wall surface in a state of being inserted into the through hole 89. As a result, it is possible to prevent the end portion of the relay member facing inwardly of the chamber from protruding into the plasma generation space S.

According to Modifications 8 and 9, an O-ring 85d or 85e is provided on the wall surface with which the stopper 91f comes into contact or on the surface 91g of the stopper 91f that comes into contact with the wall surface. Thus, when the end portion of the relay member facing inwardly of the chamber is inserted into the through hole 89, the space between the processing room and the exhaust room is sealed with the O-ring. As a result, it is possible to measure the pressure in the plasma generation space S using a pressure gauge outside the chamber 10.

According to Modifications 10 and 11, an O-ring 85f or 85g is provided on the side surface 89a of the through hole 89 or on the outside (the end side surface 91h) of the end portion of the relay member facing inwardly of the chamber. Thus, when the end portion of the relay member facing inwardly of the chamber is inserted into the through hole 89, the space between the processing room and the exhaust room is sealed with the O-ring. As a result, it is possible to measure the pressure in the plasma generation space S using a pressure gauge outside the chamber 10.

According to Modifications 12 and 13, the portion where the end portion of the relay member facing inwardly of the chamber is connected to the shield member has a gap. As a result, it is possible to omit an O-ring.

According to Modifications 12 and 13, the conductance of the gap is smaller than the conductance of the hole 86 in the shield member or the conductance of the holes 91e in the end surface at the end portion of the relay member facing inwardly of the chamber. As a result, the influence on the measurement by an instrument can be made trivial.

According to the present embodiment and Modifications 1 to 3, the relay member is capable of being driven in the horizontal direction in a state in which the inside thereof is separated from the outside by a bellows 97, 97c, or 97d or a shaft seal 97a, 97b, or 98. As a result, it is possible to accurately measure the pressure even at a driving place, such as a shield member.

In addition, according to the present embodiment and each modification, an instrument measures a state inside the processing room. As a result, it is possible to accurately measure a state in the processing room.

In addition, according to the present embodiment and each modification thereof, the instrument is at least one of a pressure gauge and a mass spectrometer configured to measure a gas present in the processing room. As a result, it is possible to accurately measure at least one of the pressure and the gas type.

It shall be understood that the embodiments disclosed herein are illustrative and not limiting in all aspects. The embodiments described above may be omitted, replaced, or modified in various forms without departing from the scope and spirit of the appended claims.

In the embodiments described above, a plasma processing apparatus 1 has been described as an example of the substrate processing apparatus, but the present disclosure is not limited thereto. For example, the present disclosure may also be applied to measurement of a pressure at a place having a driving part in various apparatuses performing evacuation (e.g., a transport apparatus).

In the embodiments described above, a pressure gauge for measuring a pressure, which is a value indicating a state in the processing room, is used, but the present disclosure is not limited thereto. For example, as another exemplary value indicating a state in the processing room, there is a type of gas present in the processing room. Thus, a mass spectrometer or the like for measuring the type of this gas may be used. An example of a mass spectrometer is a quadrupole mass spectrometer (QMS). That is, the present disclosure may also be applied to the case of using an instrument capable of measuring a value indicating a state in a processing room.

According to the present disclosure, it is possible to accurately measure a state in a processing room even at a driving location.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
a chamber including a processing room which processing is performed on a substrate using an introduced gas and an exhaust room configured to exhaust the gas in the processing room;
a shield member provided at least in a part near a side wall of the chamber so as to separate the processing room and the exhaust room from each other and including, in a portion of a wall surface of the shield member that is parallel to the side wall of the chamber, a hole that allows the processing room and the exhaust room to communicate with each other, the shield member being configured to be capable of being driven in a vertical direction; and
a hollow relay member connected to a pipe connected to an instrument outside the chamber and configured to be capable of being driven in a horizontal direction, so that, when the shield member reaches an upper end position, the relay member is driven inwardly of the chamber and is connected to the shield member at an end portion of the relay member facing inwardly of the chamber to allow the processing room and the pipe to communicate with each other through the hole.

2. The substrate processing apparatus of claim 1, wherein one or multiple holes are provided in the wall surface with which the relay member comes into contact in a region narrower than an inner diameter of the relay member.

3. The substrate processing apparatus of claim 2, wherein the shield member is provided with a recess, into which the end portion of the relay member facing inwardly of the chamber is insertable, in an external side of the wall surface with which the relay member comes into contact.

4. The substrate processing apparatus of claim 3, further comprising:
an O-ring on the wall surface with which the relay member comes into contact or on the end portion of the relay member facing inwardly of the chamber,
wherein when the end portion of the relay member facing inwardly of the chamber is in contact with the wall surface, a space between the processing room and the exhaust room is sealed with the O-ring.

5. The substrate processing apparatus of claim 4, wherein the relay member is configured to be capable of being driven in the horizontal direction in a state in which an inside thereof is separated from the outside by a bellows or a shaft seal.

6. The substrate processing apparatus of claim 5, wherein the instrument is configured to measure an internal state of the processing room.

7. The substrate processing apparatus of claim 1, wherein the shield member is provided with a recess, into which the end portion of the relay member facing inwardly of the chamber is insertable, in an external side of the wall surface with which the relay member comes into contact.

8. The substrate processing apparatus of claim 3, further comprising:
an O-ring on a side surface of the recess or on an outside of the end portion of the relay member facing inwardly of the chamber,
wherein when the end portion of the relay member facing inwardly of the chamber is inserted into the recess, a space between the processing room and the exhaust room is sealed with the O-ring.

9. The substrate processing apparatus of claim 1, further comprising:
an O-ring on the wall surface with which the relay member comes into contact or on the end portion of the relay member facing inwardly of the chamber,
wherein when the end portion of the relay member facing inwardly of the chamber is in contact with the wall surface, a space between the processing room and the exhaust room is sealed with the O-ring.

10. The substrate processing apparatus of claim 1, wherein the hole is a through hole into which the end portion of the relay member facing inwardly of the chamber is insertable.

11. The substrate processing apparatus of claim 10, wherein the end portion of the relay member facing inwardly of the chamber includes a container-shaped end surface, and the end surface includes one or multiple holes.

12. The substrate processing apparatus of claim 11, wherein the end portion of the relay member facing inwardly of the chamber includes a stopper that comes into contact with the wall surface in a state of being inserted into the through hole.

13. The substrate processing apparatus of claim 12, further comprising:
an O-ring on the wall surface with which the stopper comes into contact or on a surface of the stopper that comes into contact with the wall surface,
wherein when the end portion of the relay member facing inwardly of the chamber is inserted into the through hole, a space between the processing room and the exhaust room is sealed with the O-ring.

14. The substrate processing apparatus of claim 12, further comprising:
an O-ring on a side surface of the through hole or on an outside of the end portion of the relay member facing inwardly of the chamber,
wherein when the end portion of the relay member facing inwardly of the chamber is inserted into the through hole, a space between the processing room and the exhaust room is sealed with the O-ring.

15. The substrate processing apparatus of claim 1, wherein a portion where the end portion of the relay member facing inwardly of the chamber is connected to the shield member has a gap.

16. The substrate processing apparatus of claim 15, wherein a conductance of the gap has a value smaller than a conductance of the hole in the shield member or a conductance of the hole in the end surface at the end portion of the relay member facing inwardly of the chamber.

17. The substrate processing apparatus of claim 1, wherein the relay member is configured to be capable of being driven in the horizontal direction in a state in which an inside thereof is separated from the outside by a bellows or a shaft seal.

18. The substrate processing apparatus of claim 1, wherein the instrument is configured to measure an internal state of the processing room.

19. The substrate processing apparatus of claim 1, wherein the instrument is at least one of a pressure gauge and a mass spectrometer configured to measure a gas present in the processing room.

20. A method of driving a relay member in a substrate processing apparatus, wherein the substrate processing apparatus comprises: a chamber including a processing room in which processing is performed on a substrate using an introduced gas and an exhaust room configured to exhaust the gas in the processing room; a shield member provided at least in a part near a side wall of the chamber so as to separate the processing room and the exhaust room from each other and including, in a portion of a wall surface of the shield member that parallel to the side wall of the chamber, a hole that allows the processing room and the exhaust room to communicate with each other, the shield member being configured to be capable of being driven in a vertical direction; and a hollow relay member connected to a pipe connected to an instrument outside the chamber and configured to be capable of being driven in a horizontal direction, so that, when the shield member reaches an upper end position, the relay member is driven inwardly of the chamber and is connected to the shield member at an end portion of the relay member facing inwardly of the chamber to allow the processing room and the pipe to communicate with each other through the hole, the method comprising:

driving the relay member outwardly of the chamber to separate the relay member from the shield member in a state in which the end portion of the relay member facing inwardly of the chamber is connected to the shield member;

driving the shield member from the upper end position to a lower end position;

loading the substrate into the chamber or unloading the substrate from the chamber;

driving the shield member from the lower end position to the upper end position; and driving the relay member inwardly of the chamber to connect the relay member to the shield member.

* * * * *